(12) United States Patent
Chen et al.

(10) Patent No.: US 9,391,251 B2
(45) Date of Patent: Jul. 12, 2016

(54) CARRIER STRUCTURE AND LIGHTING DEVICE

(71) Applicant: Everlight Electronics Co., Ltd., New Taipei (TW)

(72) Inventors: Yung Chieh Chen, New Taipei (TW); Jung Chiuan Lin, New Taipei (TW)

(73) Assignee: Everlight Electronics Co., Ltd., Taiwan (TW)

( * ) Notice: Subject to any disclaimer, the term of this patent is extended or adjusted under 35 U.S.C. 154(b) by 20 days.

(21) Appl. No.: 14/273,933

(22) Filed: May 9, 2014

(65) Prior Publication Data

US 2014/0346551 A1    Nov. 27, 2014

(30) Foreign Application Priority Data

May 27, 2013   (TW) .............................. 102118646 U

(51) Int. Cl.
*H01L 33/62* (2010.01)
*H01L 33/48* (2010.01)

(52) U.S. Cl.
CPC .............. *H01L 33/62* (2013.01); *H01L 33/486* (2013.01); *H01L 2224/48091* (2013.01); *H01L 2224/48247* (2013.01)

(58) Field of Classification Search
CPC .................................................... H01L 33/62
See application file for complete search history.

(56) References Cited

U.S. PATENT DOCUMENTS

| | | | | |
|---|---|---|---|---|
| 2008/0023721 A1* | 1/2008 | Lee | ......................... | H01L 33/52 257/99 |
| 2010/0314654 A1* | 12/2010 | Hayashi | ................ | H01L 33/486 257/99 |
| 2013/0299854 A1* | 11/2013 | Lee et al. | ......................... | 257/88 |

FOREIGN PATENT DOCUMENTS

| | | |
|---|---|---|
| JP | 2008270444 | 11/2008 |
| JP | 2008282932 | 11/2008 |
| JP | 2009117822 | 5/2009 |
| JP | 2010171060 | 8/2010 |
| JP | 2013045888 | 3/2013 |
| TW | 200812042 A | 3/2008 |
| TW | 200945622 A | 11/2009 |
| TW | M435731 | 8/2012 |
| TW | M445770 | 1/2013 |

* cited by examiner

*Primary Examiner* — Peniel M Gumedzoe
*Assistant Examiner* — Christopher Johnson
(74) *Attorney, Agent, or Firm* — Han IP Corporation

(57) ABSTRACT

Various examples of a carrier structure and lighting device are described. A carrier structure configured to carry an LED includes a housing and a lead frame. The housing defines a concavity. The lead frame includes a main board portion having a main board through hole, at least two insertion portions extending from the main board portion into the main board through hole, and two electrode portions configured to be electrically coupled to the LED. The housing is disposed over the at least two insertion portions with the at least two insertion portions inserted into the housing. The concavity of the housing expose the electrode portions. Each of the electrode portions has a respective protrusion sub-portion that extends outside of the housing. Additionally, a lighting device utilizing the carrier structure is also provided.

19 Claims, 19 Drawing Sheets

CARRIER STRUCTURE AND LIGHTING DEVICE

CROSS REFERENCE TO RELATED PATENT APPLICATION

The present disclosure claims the priority benefit of Taiwan Patent Application No. 102118646, filed on 27 May 2013, which is incorporated by reference in its entirety.

TECHNICAL FIELD

The present disclosure relates to a carrier structure and lighting device and, more particularly, to a carrier structure that improves the issue with debris and a lighting device less prone to producing debris.

BACKGROUND

Light-emitting diodes (LEDs) have many benefits such as long useful life, compact size, high shock resistance, low heat generation and low power consumption. Thus, LEDs have been widely adopted in applications including household appliances as well as indicators and light sources of various types of equipment. In recent years, progress has been made in the development of multi-color and high-brightness LEDs, enabling applications of LEDs in large outdoor display panels, traffic signals and related fields. In the future, it is possible for LEDs to become the mainstream lighting sources with both energy saving and environment-friendly features. To improve reliability of LEDs, LEDs are typically packaged during the manufacturing process into a durable lighting device.

In the manufacturing process of conventional lighting devices, one or more LEDs are fixed onto a carrier structure that includes a housing and lead frame. Then, other steps such as wire bonding and encapsulation are carried out. Lastly, the housing and the one or more LEDs I are separated from the lead frame to form the lighting device. During the process of separating the housing and the one or more LEDs from the lead frame may fall off due to deformation of the lead frame given the forces exerted on the lead frame the housing and the one or more LEDs disposed on the lead frame. Specifically, severe friction between the lead frame and housing may occur during the separating process, and often times the lead frame may scratch edges of the housing to cause damage. Consequently, debris of the housing may fall on the lighting device, negatively affecting optical inspection of the lighting device to result in the manufacturing process being not smooth.

SUMMARY

The present disclosure provides a carrier structure that improves the issue with debris associated with the prior art.

The present disclosure provides a lighting device on which it is not easy for debris to fall, and a manufacturing process for making such a device which flows smoothly.

According to one aspect, a carrier structure configured to carry an LED may include a housing and a lead frame. The housing may define a concavity. The lead frame may include a main board portion having a main board through hole, at least two insertion portions extending from the main board portion into the main board through hole, and two electrode portions configured to be electrically coupled to the LED. The housing may be disposed over the at least two insertion portions that the at least two insertion portions are inserted into the housing. The concavity of the housing may expose the electrode portions. Each of the electrode portions may have a respective protrusion sub-portion that extends outside of the housing.

In some embodiments, the at least two insertion portions may include a first insertion portion and a second insertion portion. The two electrode portions may include a first electrode portion and a second electrode portion. The respective protrusion sub-portion of the first electrode portion may include a first protrusion sub-portion. The respective protrusion sub-portion of the second electrode portion may include a second protrusion sub-portion. The first protrusion sub-portion, the first insertion portion, the second protrusion sub-portion and the second insertion portion may be arranged in a clockwise order.

In some embodiments, the housing may include a first sidewall and a second sidewall that are opposite and parallel to one another. The first sidewall of the housing may cover the first insertion portion and the first electrode portion. The second sidewall of the housing may cover the second insertion portion and the second electrode portion.

In some embodiments, the housing may include a first sidewall and a second sidewall that are opposite and parallel to one another. The housing may further include a third sidewall and a fourth sidewall that are opposite and parallel to one another, with the third sidewall connecting the first and second sidewalls, and also with the fourth sidewall connecting the first and second sidewalls. The first sidewall of the housing may cover the first electrode portion. The third sidewall of the housing may cover the first insertion portion. The second sidewall of the housing may cover the second electrode portion. The fourth sidewall of the housing may cover the fourth electrode portion.

In some embodiments, the first insertion portion and the second insertion portion may form a reference line that is not parallel to the first sidewall of the housing.

In some embodiments, the reference line may be perpendicular to the first sidewall of the housing.

In some embodiments, the first insertion portion and the second insertion portion may form a reference line that is parallel to the first sidewall of the housing.

In some embodiments, the housing and the electrode portions may have a combined center of mass. A reference line connecting the insertion portions may traverse through a direct projection of the center of mass on a plane defined by the main board portion.

In some embodiments, the housing may include a bottom and a second sidewall that is connected to the bottom. The electrode portions of the lead frame may be embedded in the bottom of the housing. The bottom and the second sidewall of the housing may define the concavity. The concavity may be configured to receive the LED therein. One of the electrode portions may include a carrier sub-portion facing the LED. The second sidewall of the housing may protrude in a direction which is perpendicular to the carrier sub-portion and cover one of the insertion portions at least partially.

In some embodiments, at least one of the insertion portions may include an insertion through hole, and the insertion through hole may be embedded in the housing.

In some embodiments, at least one of the insertion portions may include a rough surface, and the adjacent surface of the housing may be substantially conformed with the rough surface of the at least one of the insertion portions.

In some embodiments, at least one of the insertion portions may include an insertion corner, and the insertion corner may be embedded in the housing.

In some embodiments, at least one of the insertion portions may include a bending sub-portion, and the bending sub-portion may generally extend in a direction toward an opening of the concavity and may be buried in the housing.

In some embodiments, the electrode portions and the main board portion may be separate and electrically insulated from each other. The protrusion sub-portion of at least one of the electrode portions may be configured to receive an inspection signal.

In some embodiments, the at least one of the electrode portions may further include a carrier sub-portion connected to the protrusion sub-portion. The housing may surround and expose the carrier sub-portion.

According to another aspect, a lighting device may include an LED, a housing which defines a concavity, and a lead frame. The lead frame may include at least two insertion portions extending into the housing and two electrode portions electrically coupled to the LED. The concavity of the housing may expose the electrode portions. Each of the electrode portions may have a respective protrusion sub-portion that extends outside of the housing.

In some embodiments, the at least two insertion portions may include a first insertion portion and a second insertion portion. The two electrode portions may include a first electrode portion and a second electrode portion. The respective protrusion sub-portion of the first electrode portion may include a first protrusion sub-portion. The respective protrusion sub-portion of the second electrode portion may include a second protrusion sub-portion. The first protrusion sub-portion, the first insertion portion, the second protrusion sub-portion and the second insertion portion may be arranged in a clockwise order.

In some embodiments, the housing and the electrode portions may have a combined center of mass. A reference line connecting the insertion portions may traverse through a direct projection of the center of mass on a plane defined by the main board portion.

In some embodiments, the housing may include a bottom and a second sidewall that is connected to the bottom. The electrode portions of the lead frame may be embedded in the bottom of the housing. The bottom and the second sidewall of the housing may define the concavity. The LED may be disposed in the concavity. One of the electrode portions may include a carrier sub-portion facing the LED. The second sidewall of the housing may protrude in a direction which is perpendicular to the carrier sub-portion and cover one of the insertion portions at least partially.

In some embodiments, at least one of the insertion portions may include an insertion through hole, and the insertion through hole may be embedded in the housing.

In some embodiments, at least one of the insertion portions may include a rough surface, and the housing may embed the rough surface of the at least one of the insertion portions.

In some embodiments, at least one of the insertion portions may include an insertion corner, and the insertion corner may be embedded in the housing.

In some embodiments, at least one of the insertion portions may include a bending sub-portion, and the bending sub-portion may generally extend in a direction toward an opening of the concavity and may be buried in the housing.

In some embodiments, the protrusion sub-portion of at least one of the electrode portions may be configured to receive an inspection signal.

In some embodiments, the at least one of the electrode portions may further include a carrier sub-portion connected to the protrusion sub-portion. The housing may surround and expose the carrier sub-portion.

Some preferred embodiments are described below with reference to the attached drawings to aid better understanding of the objectives, technical features and advantages of the present disclosure.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

Each of FIGS. 1A-1F is a top view of a respective step of a manufacturing process of a lighting device in accordance with an embodiment of the present disclosure.

Each of FIGS. 2A-2F is a cross-sectional view of a respective step of a manufacturing process of a lighting device in accordance with an embodiment of the present disclosure.

Figure 3:
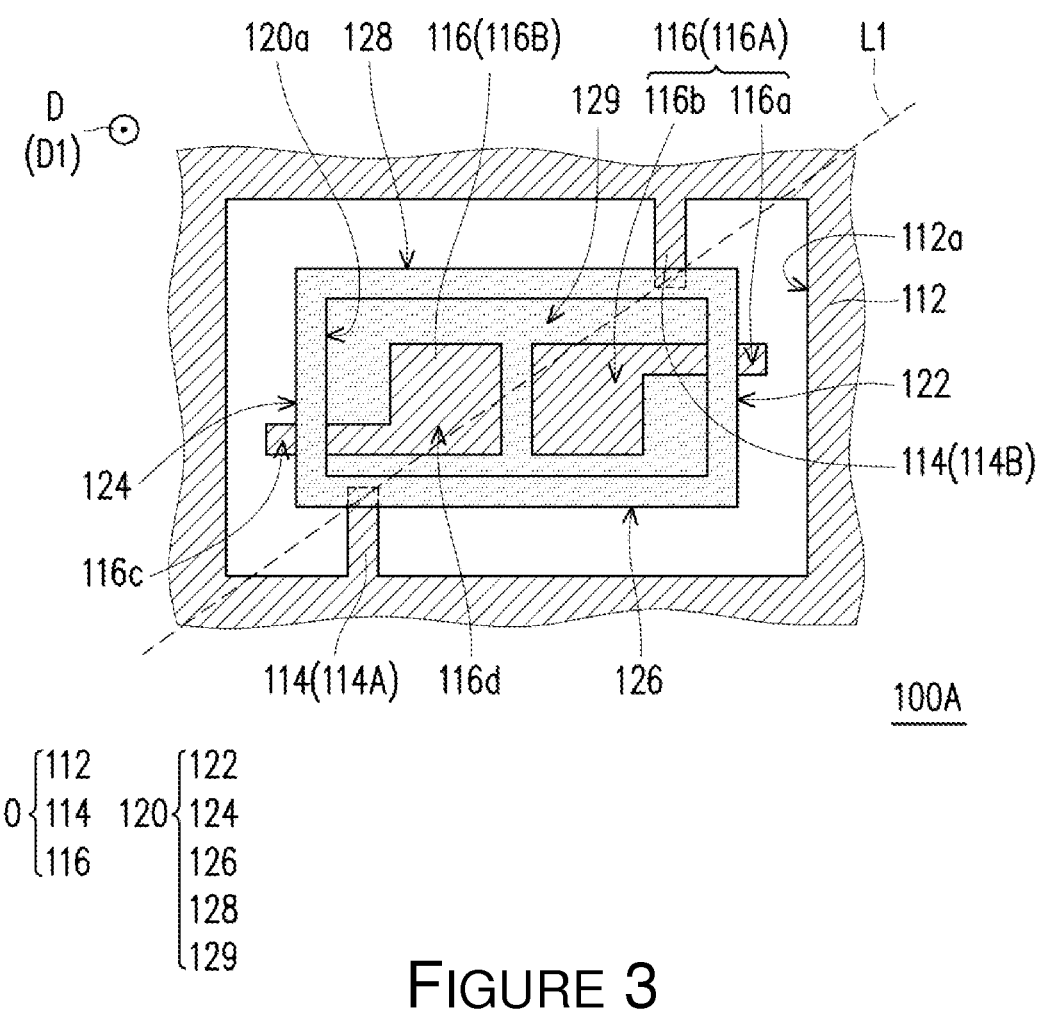

FIG. 3 is a top view of a carrier structure in accordance with an embodiment of the present disclosure.

Figure 4:
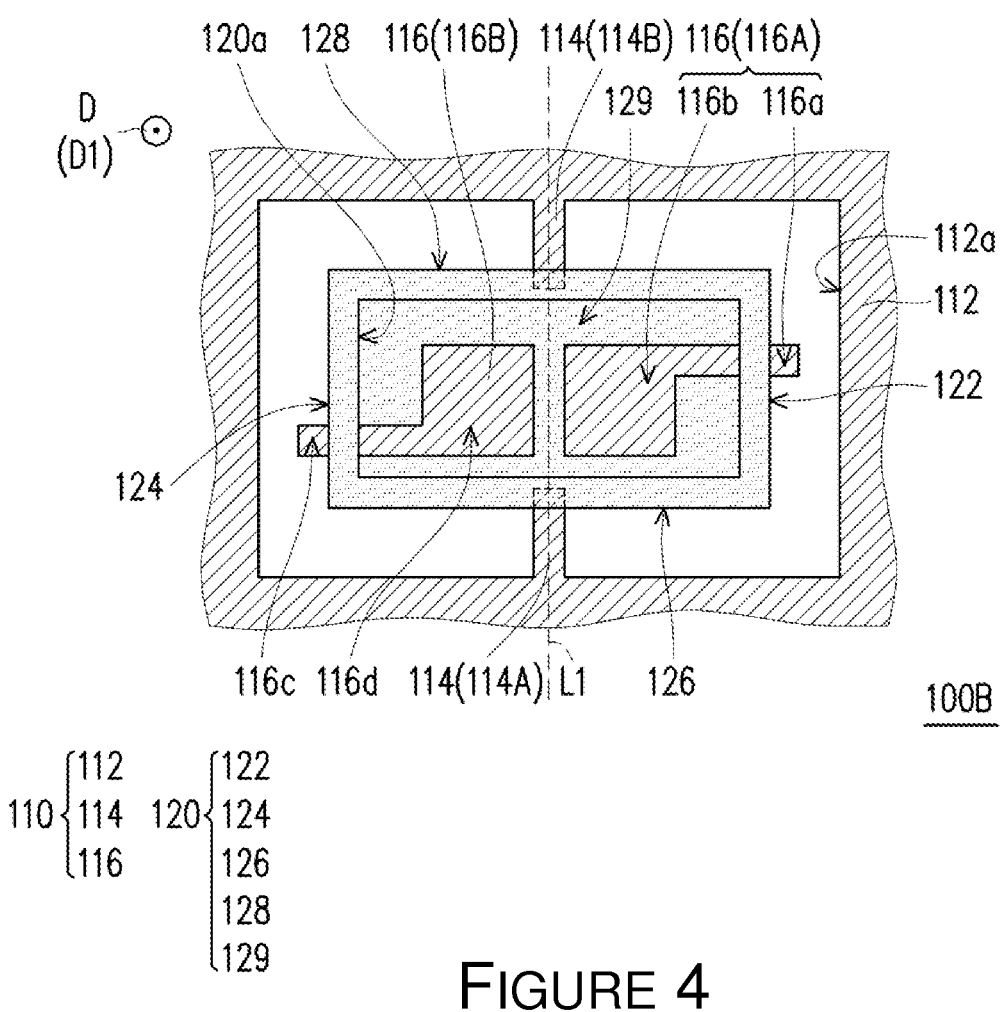

FIG. 4 is a top view of a carrier structure in accordance with another embodiment of the present disclosure.

Figure 5:
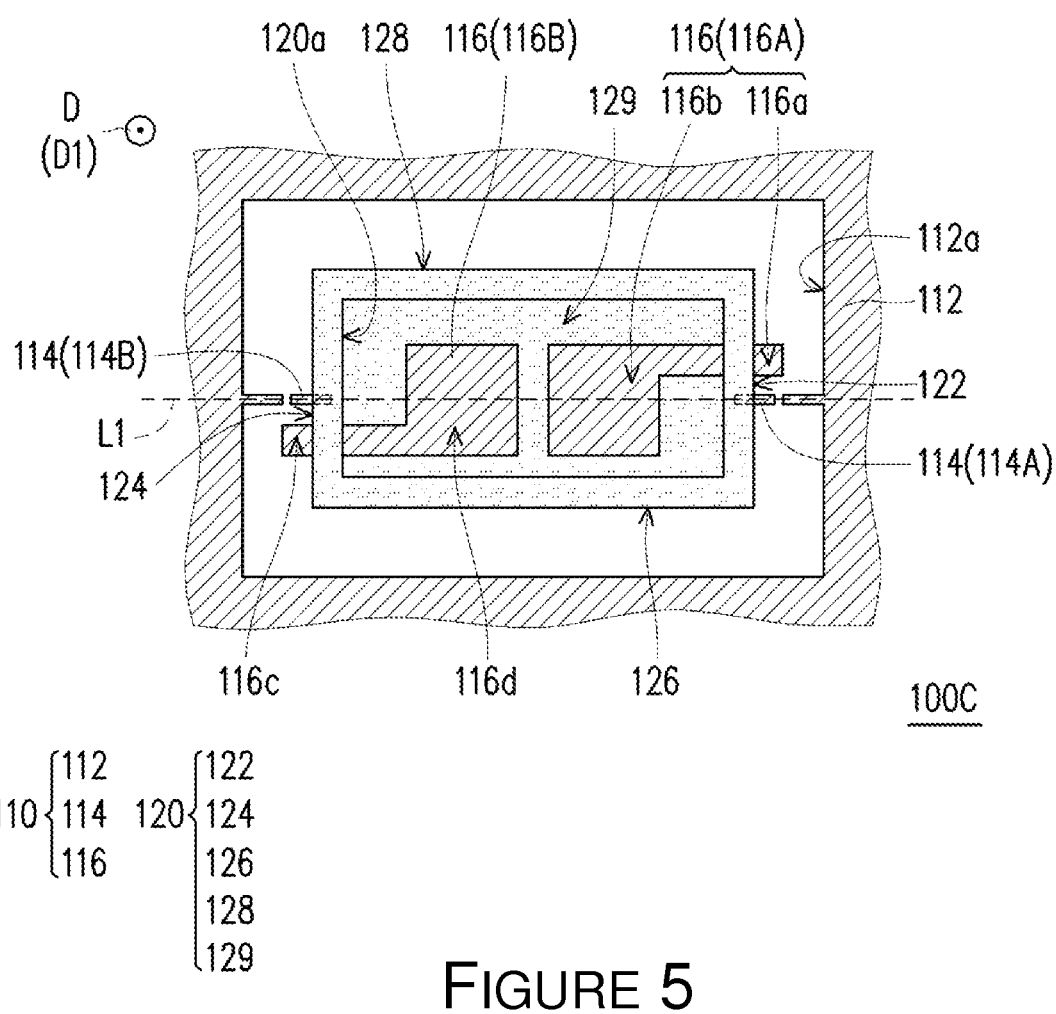

FIG. 5 is a top view of a carrier structure in accordance with yet another embodiment of the present disclosure.

Figure 6A:
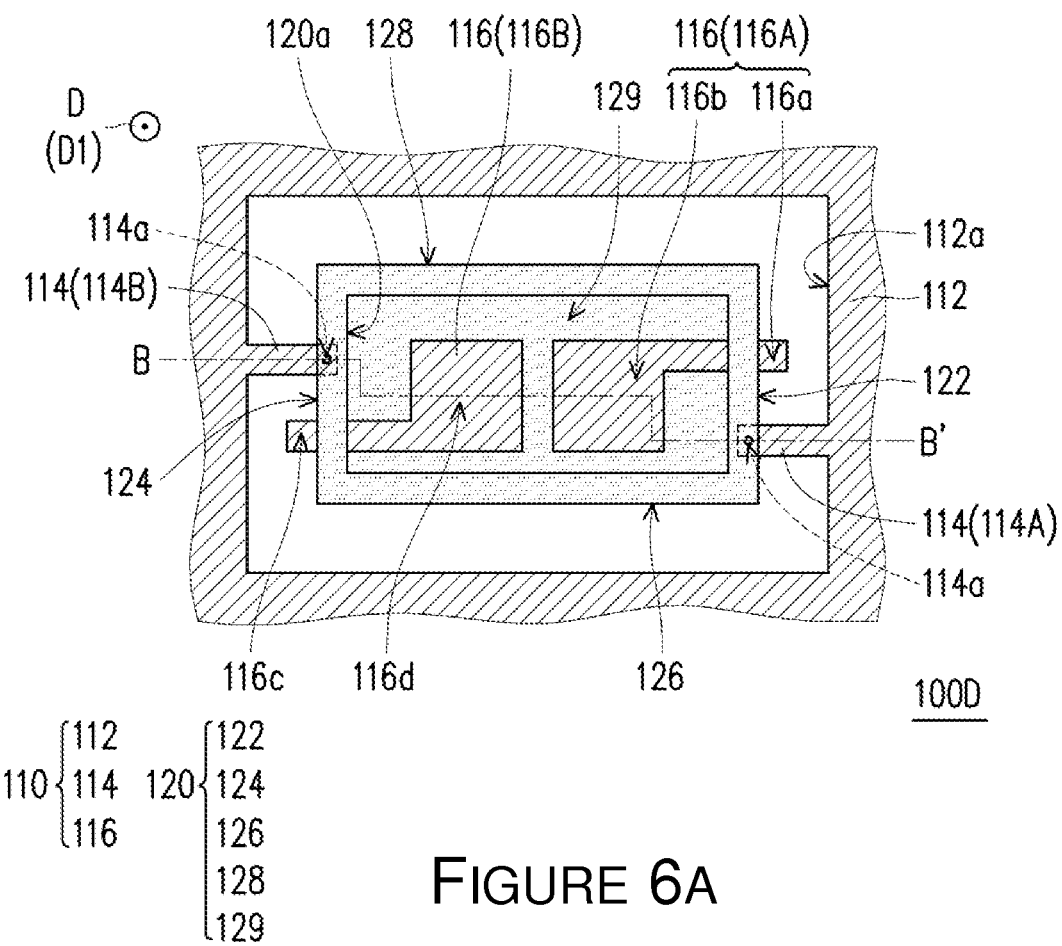

FIG. 6A is a top view of a carrier structure in accordance with an embodiment of the present disclosure.

Figure 6B:
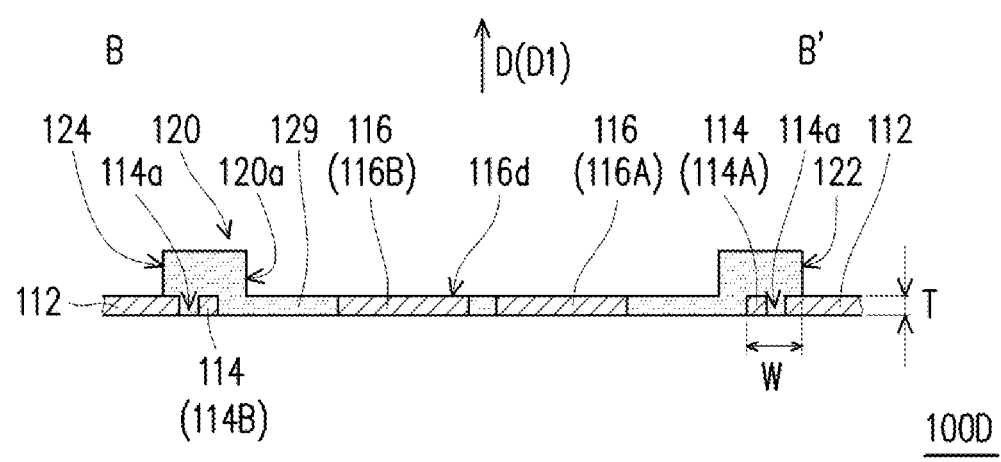

FIG. 6B is a cross-sectional view of the carrier structure of FIG. 6A along line BB'.

Figure 7A:
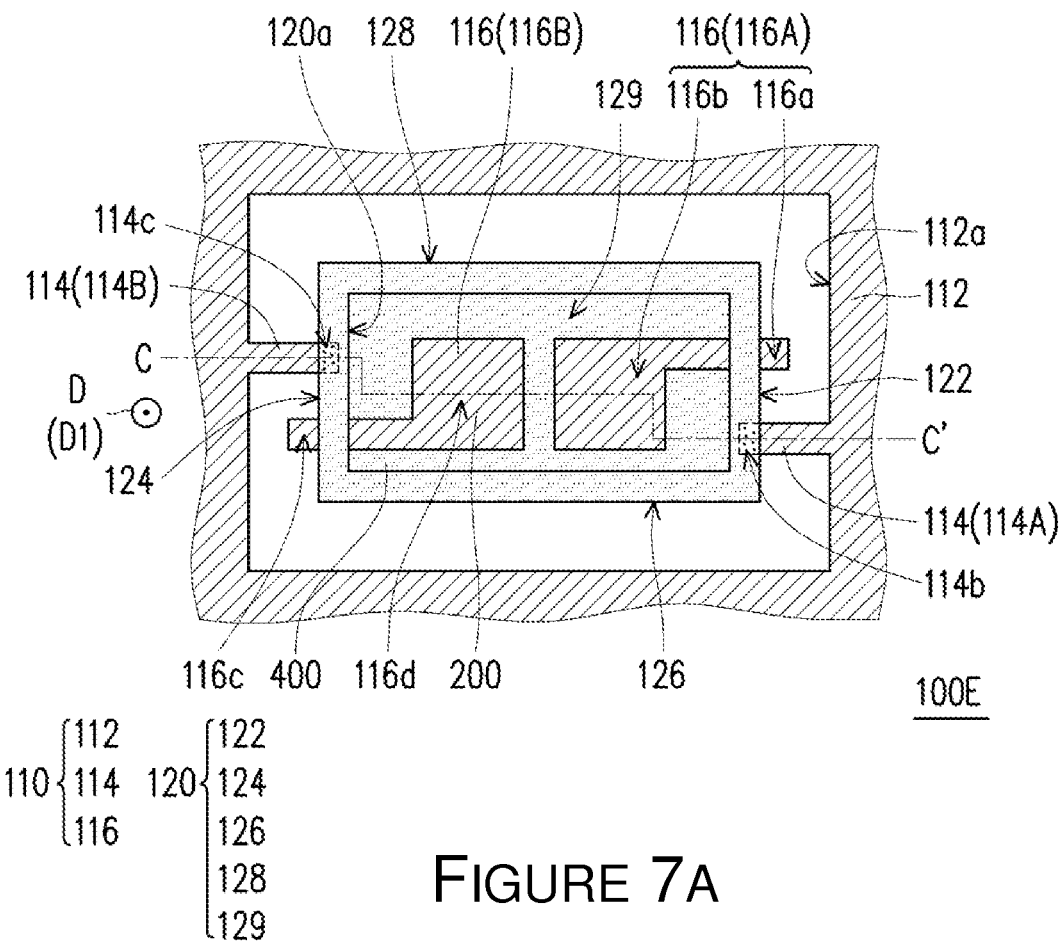

FIG. 7A is a top view of a carrier structure in accordance with an embodiment of the present disclosure.

Figure 7B:
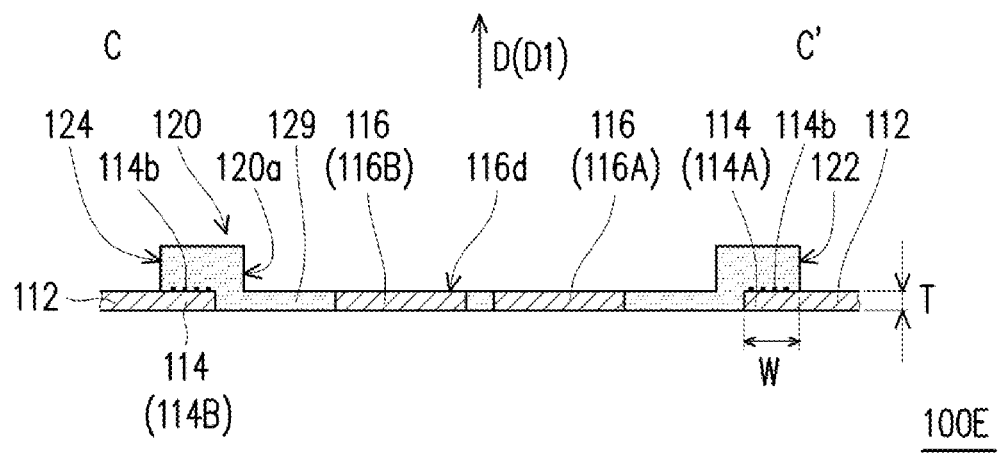

FIG. 7B is a cross-sectional view of the carrier structure of FIG. 7A along line CC'.

Figure 8:
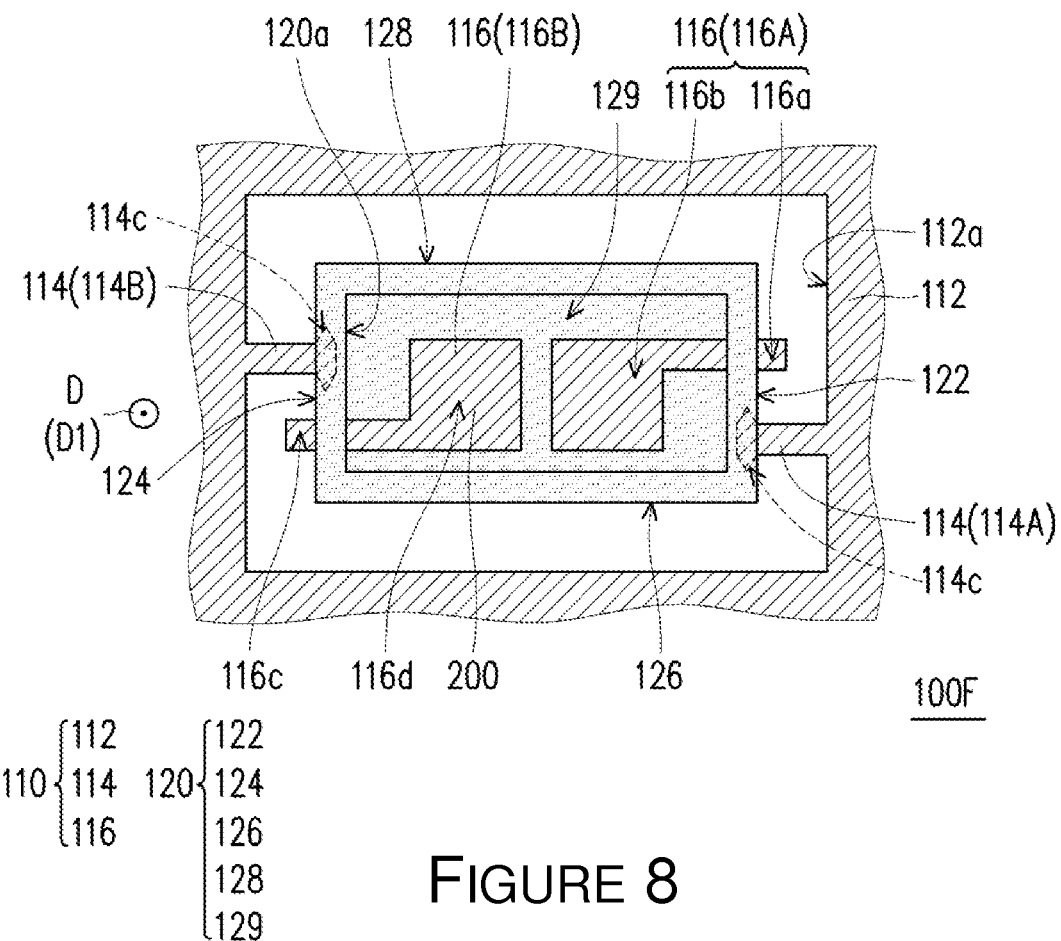

FIG. 8 is a top view of a carrier structure in accordance with an embodiment of the present disclosure.

Figure 9:
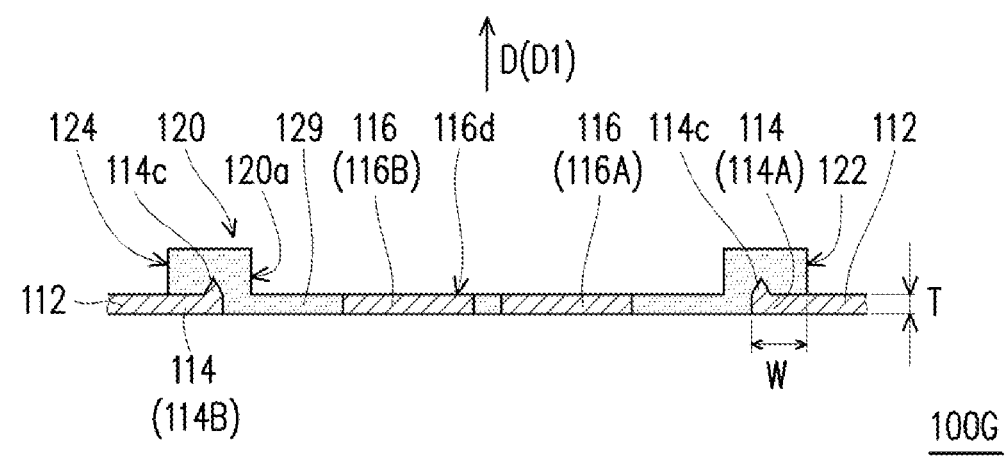

FIG. 9 is a cross-sectional view of a carrier structure in accordance with an embodiment of the present disclosure.

Figure 10:
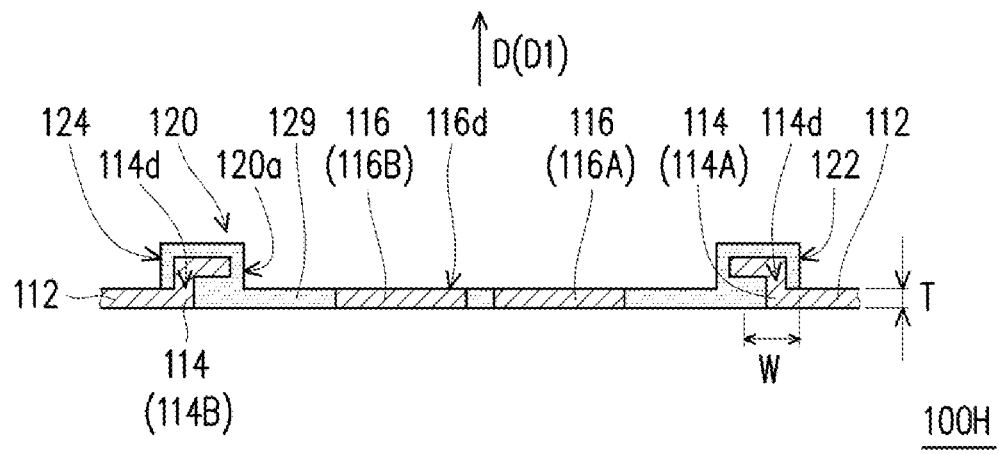

FIG. 10 is a cross-sectional view of a carrier structure in accordance with an embodiment of the present disclosure.

Figure 11:
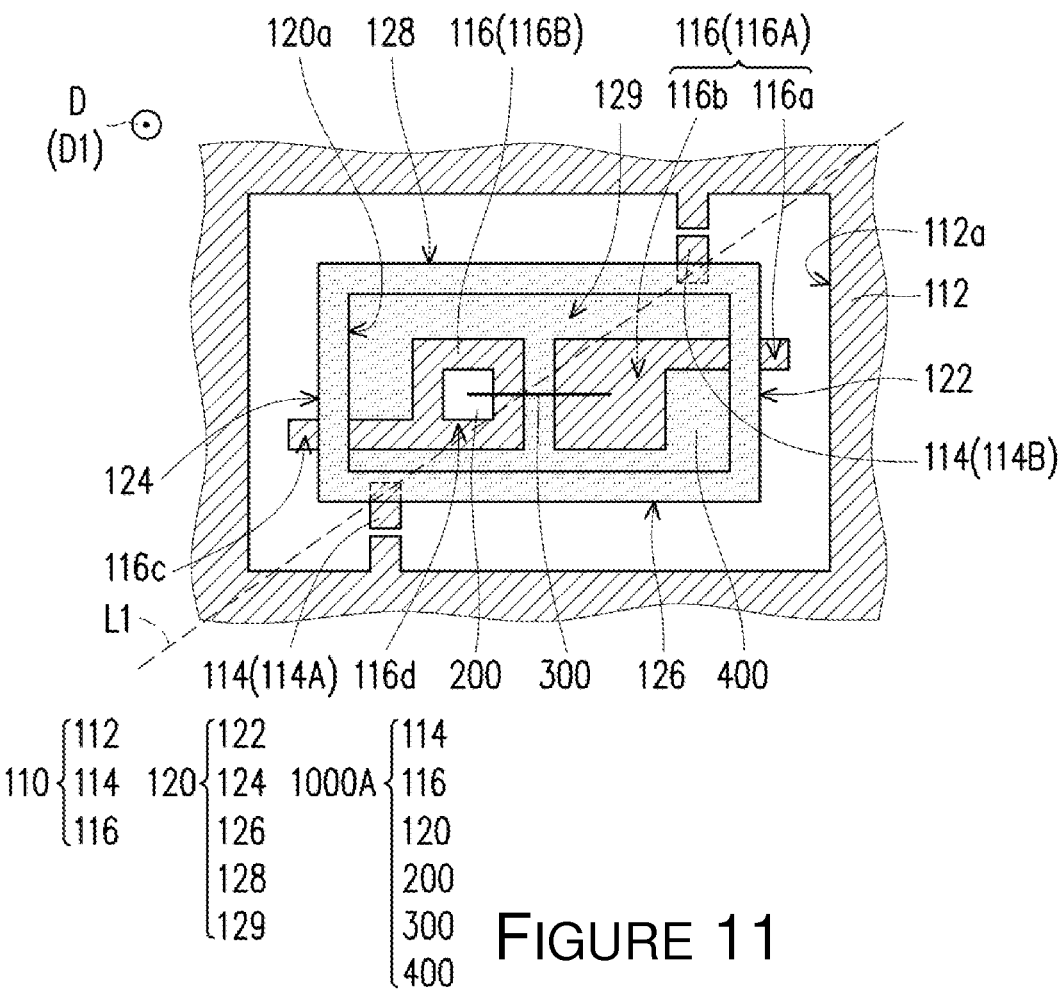

FIG. 11 is a diagram of a lighting device manufactured with the carrier structure of FIG. 3 according to a manufacturing process in accordance with the present disclosure.

Figure 12:
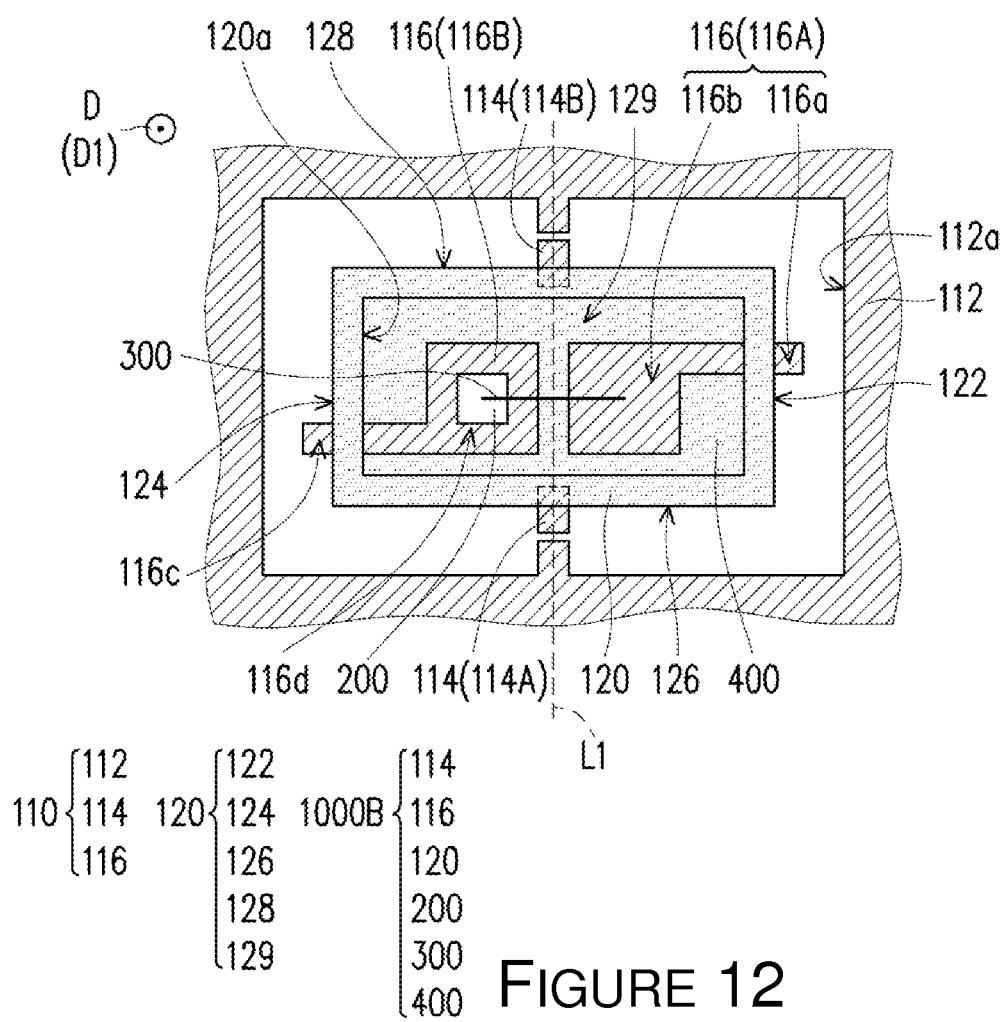

FIG. 12 is a diagram of a lighting device manufactured with the carrier structure of FIG. 4 according to a manufacturing process in accordance with the present disclosure.

Figure 13:
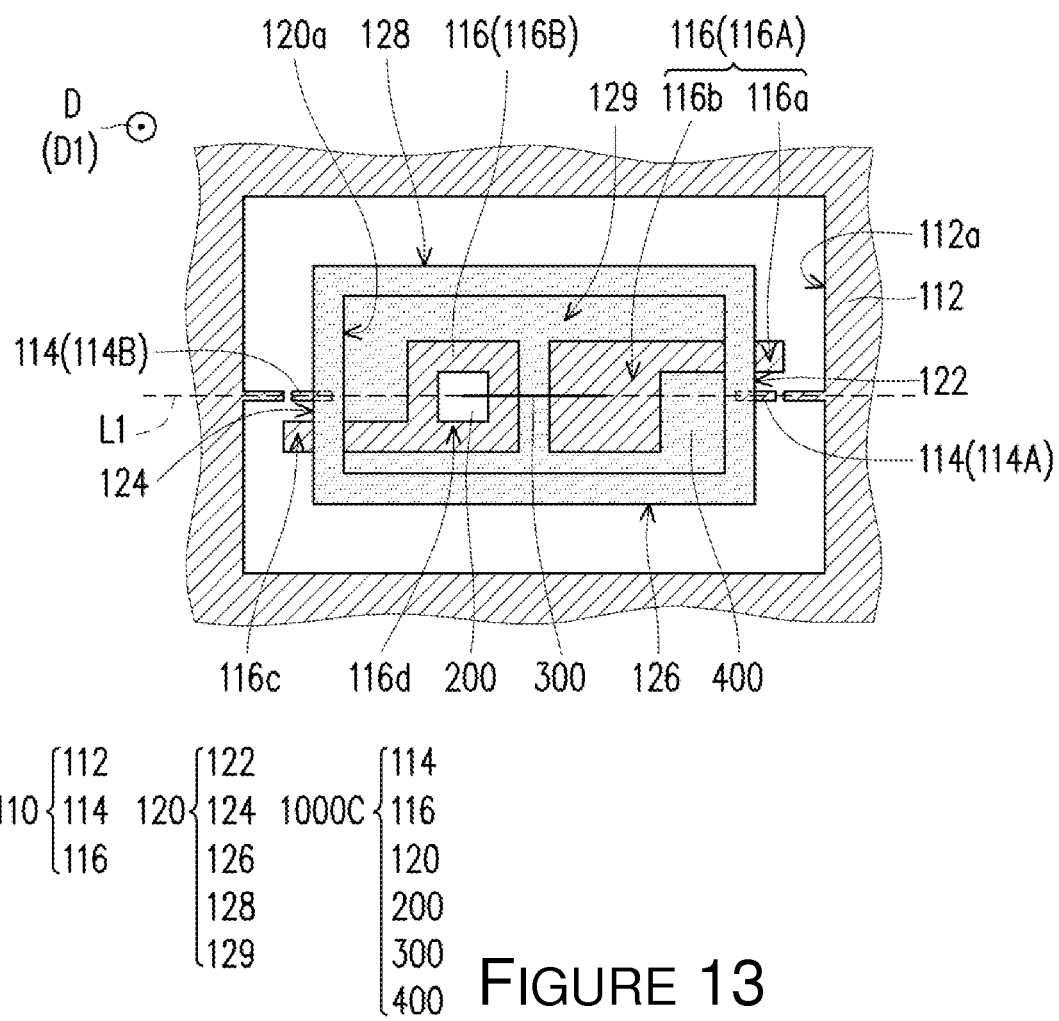

FIG. 13 is a diagram of a lighting device manufactured with the carrier structure of FIG. 5 according to a manufacturing process in accordance with the present disclosure.

Figure 14A:
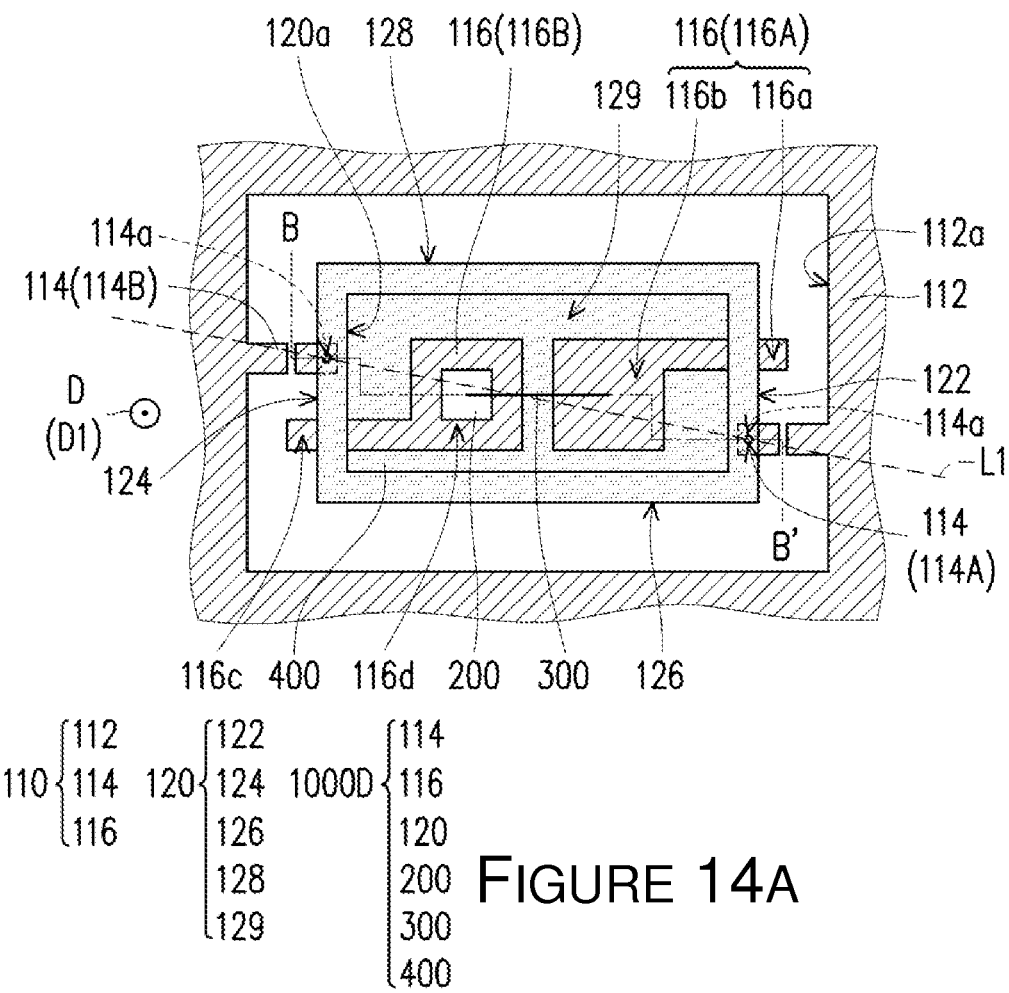
Figure 14B:
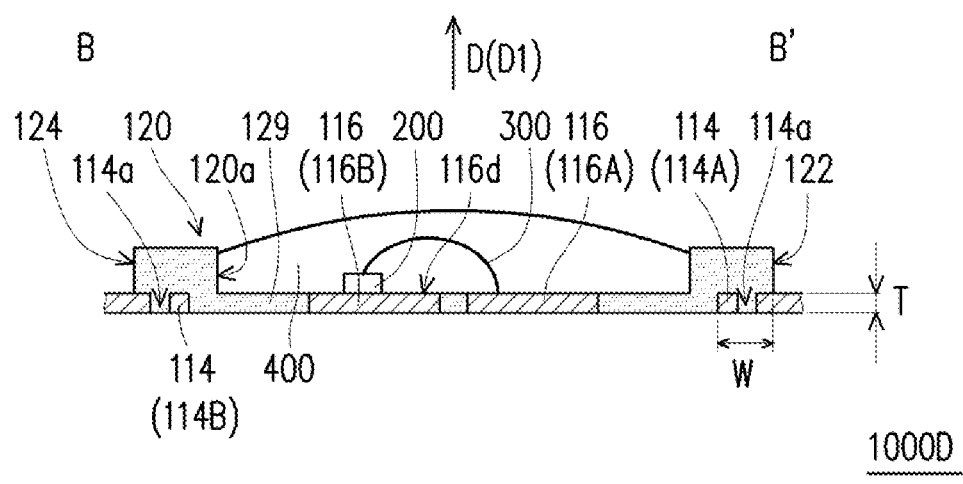

FIGS. 14A and 14B are diagrams of a lighting device manufactured with the carrier structure of FIGS. 6A and 6B, respectively, according to a manufacturing process in accordance with the present disclosure.

Figure 15A:
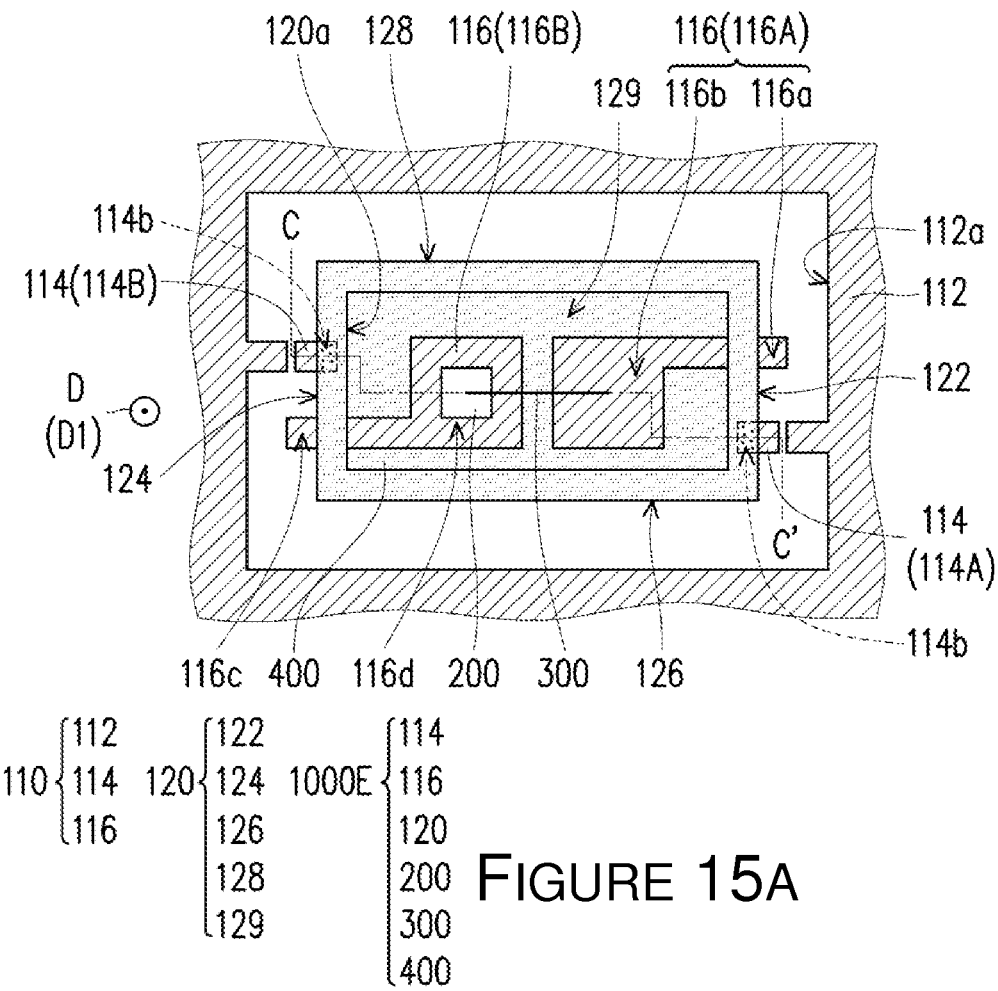
Figure 15B:
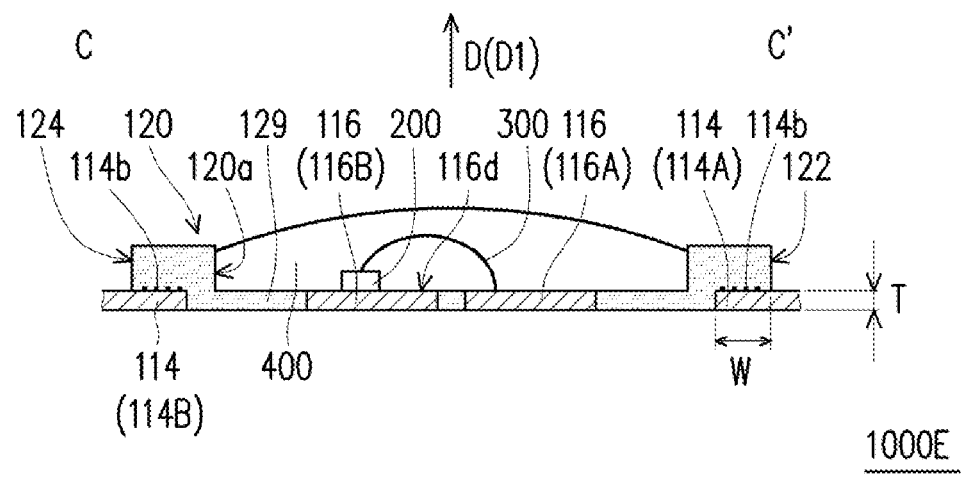

FIGS. 15A and 15B are diagrams of a lighting device manufactured with the carrier structure of FIGS. 7A and 7B, respectively, according to a manufacturing process in accordance with the present disclosure.

Figure 16:
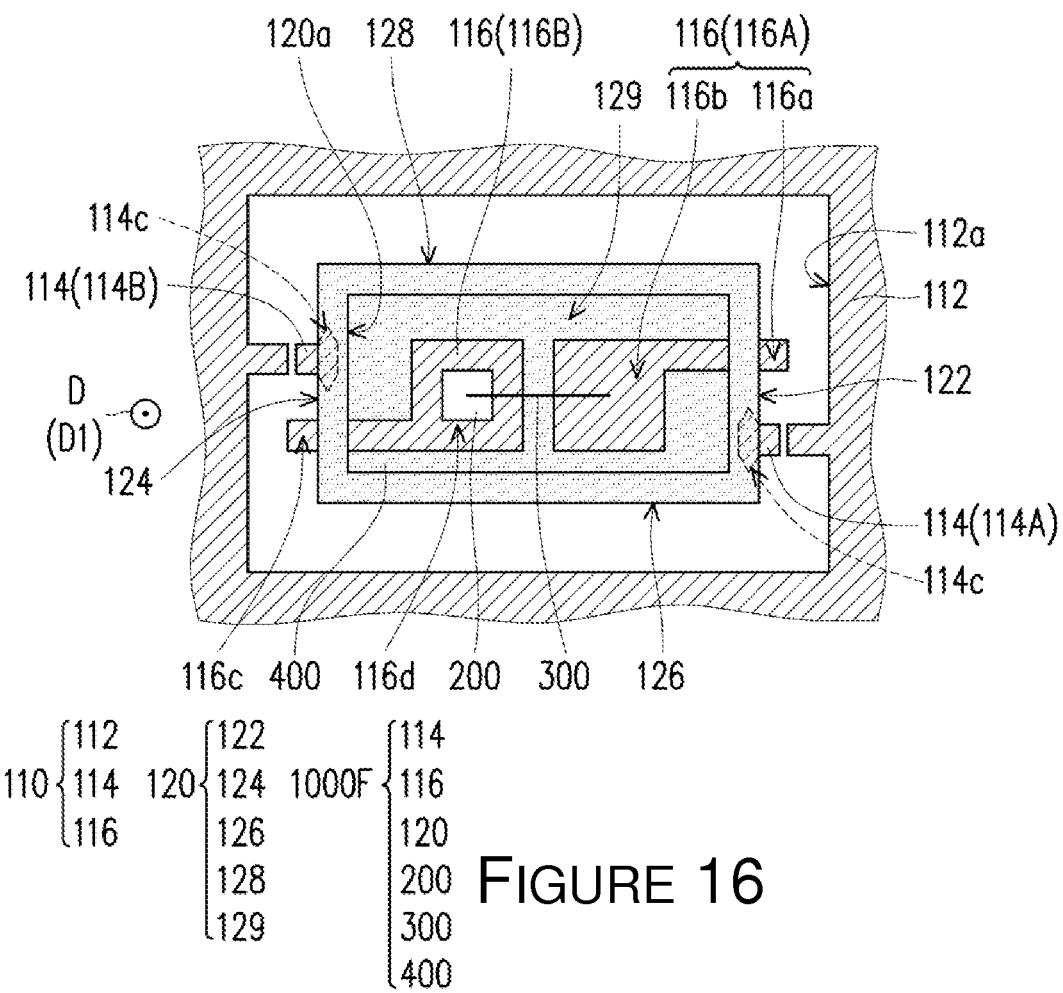

FIG. 16 is a diagram of a lighting device manufactured with the carrier structure of FIG. 8 according to a manufacturing process in accordance with the present disclosure.

Figure 17:
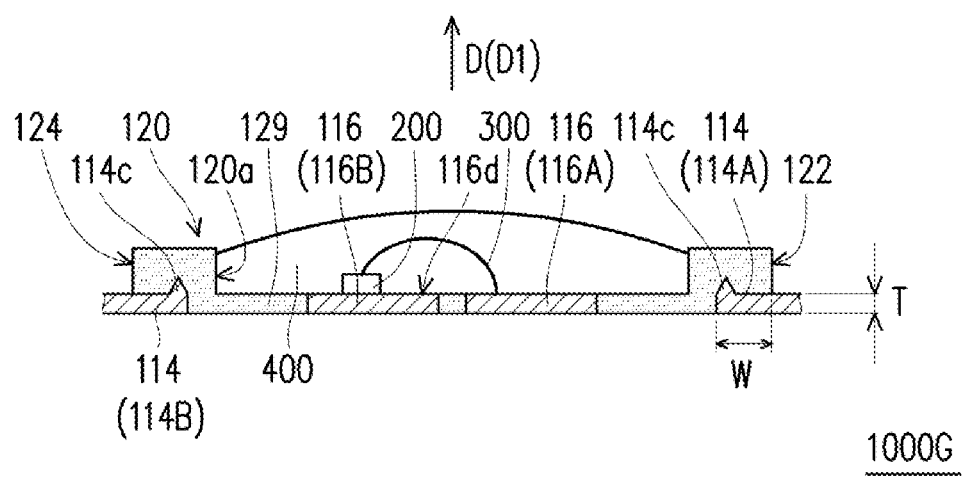

FIG. 17 is a diagram of a lighting device manufactured with the carrier structure of FIG. 9 according to a manufacturing process in accordance with the present disclosure.

Figure 18:
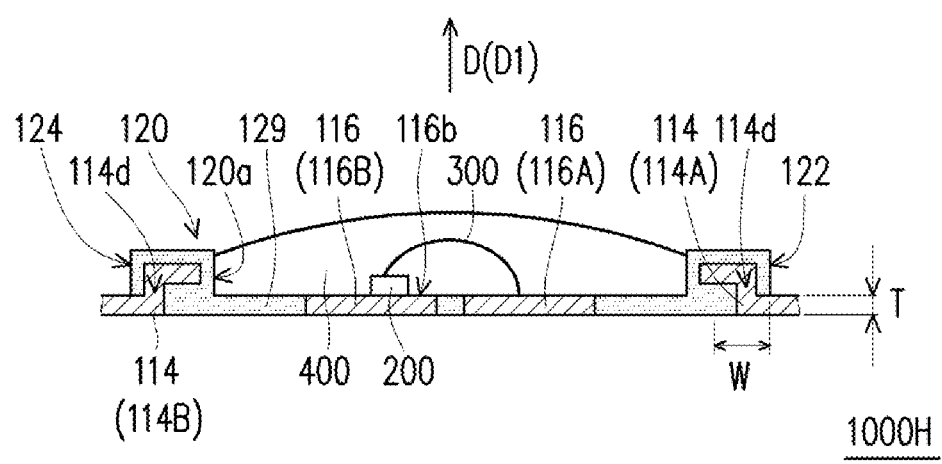

FIG. 18 is a diagram of a lighting device manufactured with the carrier structure of FIG. 10 according to a manufacturing process in accordance with the present disclosure.

DETAILED DESCRIPTION OF DISCLOSED EMBODIMENTS

Figure 1A:
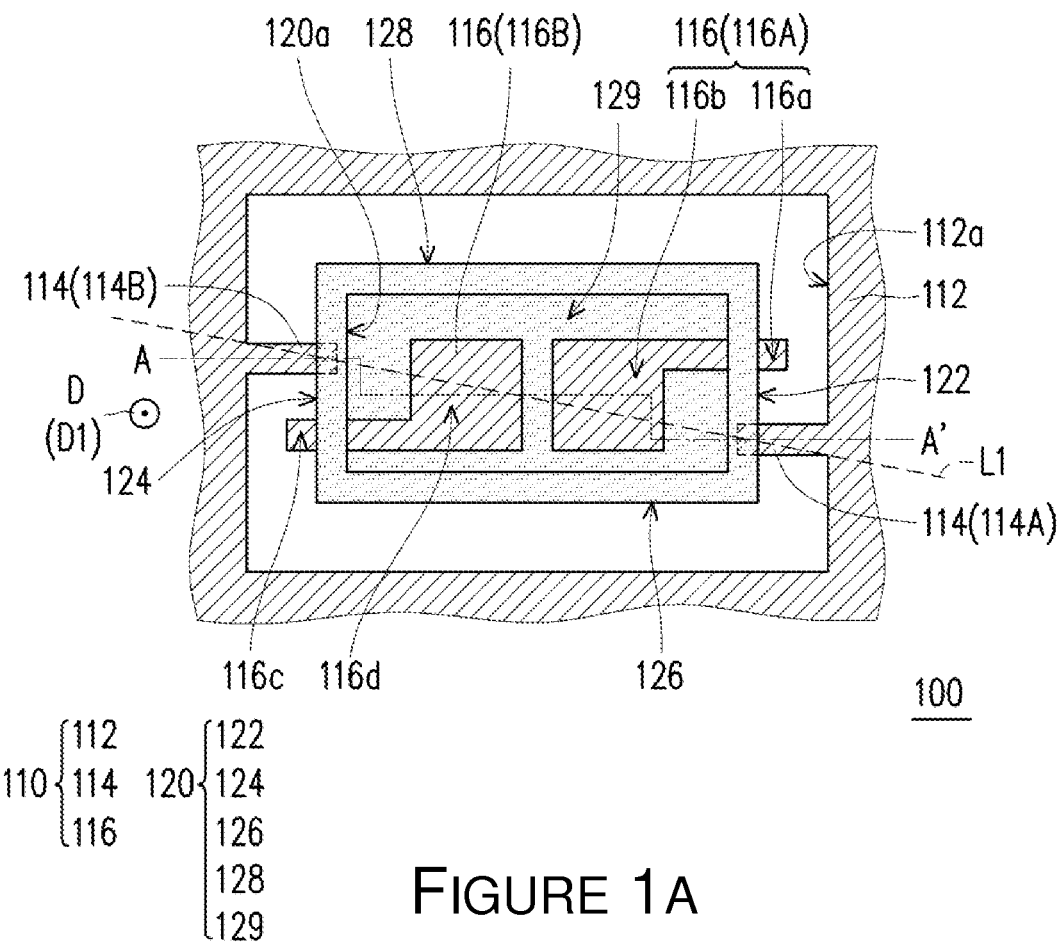
Figure 2A:
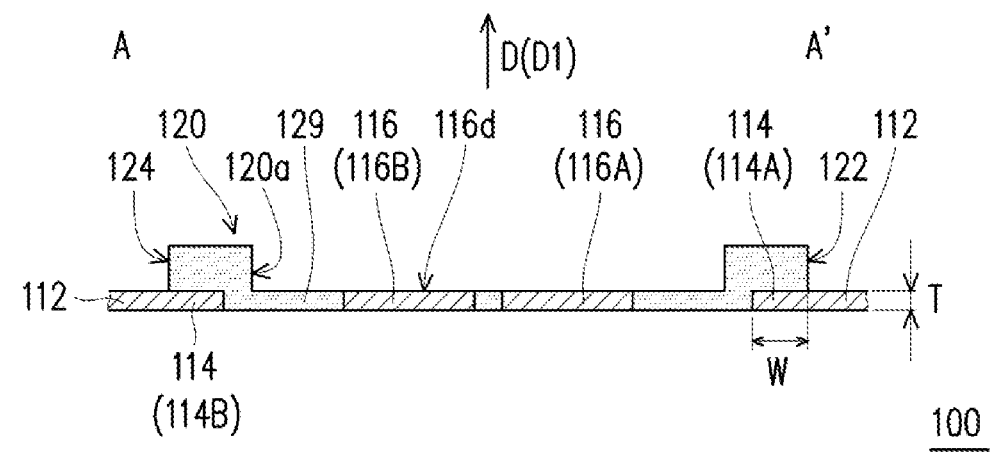

Each of FIGS. 1A-1F is a top view of a respective step of a manufacturing process of a lighting device in accordance with an embodiment of the present disclosure. Each of FIGS. 2A-2F is a cross-sectional view of a respective step of a manufacturing process of a lighting device in accordance with an embodiment of the present disclosure. Specifically, FIGS. 2A-2F correspond to a cross-sectional along line AA' of FIGS. 1A-1F, respectively. Referring to FIGS. 1A and 2A, a carrier structure 100 is provided for carrying one or more LEDs thereon. Carrier structure 100 includes lead frame 110 and housing 120. Housing 120 includes concavity 120a. Lead frame 110 includes main board portion 112 which has main board through hole 112a. Lead frame 110 also includes at least two insertion portions 114 that are coupled to the main board portion 112 and extend into the main board through hole 112a. Lead frame 110 further includes two electrode portions 116 (116A and 116B) that are disposed in the main board through hole 112a and configured to be electrically coupled to one or more LEDs.

Housing 120 is disposed on insertion portions 114 and in main board through hole 112a. In particular, as shown in FIG. 2A, in one embodiment, insertion portions 114 extend into housing 120 to function as support for housing 120. In one embodiment, a length W by which insertion portions 114 extended into housing 120 is approximately 2.5 times a thickness T of insertion portions 114. This feature allows insertion portions 114 to provide better support. It is noteworthy that the scope of the present disclosure is not limited to the embodiments described herein.

In one embodiment, the main board portion 112, insertion portions 114 and two electrode portions 116 of the lead frame 110 may be made from the same electrically-conductive board. Thus, the main board portion 112, insertion portions 114 and two electrode portions 116 may be made of the same materials (e.g., suitable electrically-conductive material). The main board portion 112, insertion portions 114 and electrode portions 116 may be on the same plane (e.g., the surface of the page of FIG. 1A).

Housing 120 expose the electrode portions 116. Specifically, as shown in FIG. 1A, in one embodiment each electrode portion 116A (116B) has, respectively, a protrusion sub-portion 116a (116c) configured for input of inspection signals, and a carrier sub-portion 116b (116d) configured for carrying and electrically coupling to bonding wire(s) of one or more LEDs. Housing 120 surrounds carrier sub-portions 116b and 116d. The concavity 120a on housing 120 exposes carrier sub-portions 116b and 116d. Protrusion sub-portions 116a and 116c protrude out of and are exposed by housing 120. In particular, protrusion sub-portions 116a and 116c of electrode portions 116A and 116B are disposed between housing 120 and main board portion 112, and are separate from main board portion 112. Electrode portions 116 and insertion portions 114 are separate from each other. In other words, electrode portions 116 and one or more LEDs suitable for electrically coupling to electrode portions 116 are electrically insulated from main board portion 112 and insertion portions 114.

In one embodiment, the at least two insertion portions 114 include first insertion portion 114A and second insertion portion 114B. The two electrode portions 116 include first electrode portion 116A and a second electrode portion 116B. It is noteworthy that, the number and position of disposition of the insertion portions and electrodes of the present disclosure are not limited to those illustrated in FIGS. 1A and 2A. The number and position of disposition of electrodes may depend on the number of LEDs to be placed in the through hole and the desired optical characteristics to be achieved. The number and position of disposition of insertion portions may depend on the stability of support of housing 120 and electrode portions 116. In one embodiment, housing 120 covers a part of the first insertion portion 114A and a part of the second insertion portion 114B. Specifically, each of the first insertion portion 114A and the second insertion portion 114B respectively includes two opposing ends. One end of each of the first insertion portion 114A and the second insertion portion 114B is in contact with main board portion 112 and is exposed outside of housing 120. The other end of each of the first insertion portion 114A and the second insertion portion 114B is embedded in and covered by housing 120.

In one embodiment, housing 120 includes corresponding first sidewall 122 and second sidewall 124 that are opposite and parallel to one another. Housing also includes third sidewall 126 that connects the first sidewall 122 and the second sidewall 124, fourth sidewall 128 which is opposite to the third sidewall 126 and connects the first sidewall 122 and the second sidewall 124, and bottom 129 which connects to all the sidewalls. However, it is to be noted that the number of sidewalls of housing of the present disclosure is not limited to what is described herein. Besides, the overall shape of the housing needs not be a square and may depend on the requirement of actual implementations. In some other embodiments, a reflection layer may optionally be disposed in concavity 120a of housing 120 to enhance optical characteristics of a lighting device that adopts the carrier structure of the present disclosure.

In one embodiment, electrode portions 116 of lead frame 110 are embedded in the bottom 129. The bottom 129, the first sidewall 122, the second sidewall 124 and the third sidewall 126 of housing 120 define the concavity 120a. One or more LEDs may be disposed in the concavity 120a, as shown in FIG. 2A, and one of the electrode portions 116 (e.g., electrode portion 116B) includes the carrier sub-portion 116d that may face toward the one or more LEDs. The second sidewall 124 of housing 120 protrudes in a direction D which is perpendicular to the carrier sub-portion 116d and covers a part of insertion portions 114 (e.g., the second insertion portion 114B).

In one embodiment, in the top view thereof (e.g., viewing in a direction perpendicular to the main board portion 112), the first protrusion sub-portion 116a, the first insertion portion 114A, the second protrusion sub-portion 116c, the second insertion portion 114B may be arranged in a clockwise order. That is, in one embodiment, the first sidewall 122 of housing 120 may cover the first electrode portion 116A to which the first insertion portion 114A and the first protrusion sub-portion 116a belong. The second sidewall 124 of housing 120 may cover the second electrode portion 116B to which the second insertion portion 114B and the second protrusion sub-portion 116c belong. In other words, a part of the first insertion portion 114A and a part of the first electrode portion 116A covered by housing 120 may be on the same side. A part of the second insertion portion 114B and a part of the second electrode portion 116B covered by housing 120 may also be on the same side. When an electrode and a respective insertion portion are on the same side, the support of housing 120 and electrode portions 116 provided by the insertion portions 114 is greatly enhanced.

Furthermore, in one embodiment, the first insertion portion 114A and the second insertion portion 114B may form a straight reference line L1. More specifically, in the present disclosure, reference line L1 refers to a straight line formed by a part of the first insertion portion 114A covered by housing 120 and a part of the second insertion portion 114B covered by housing 120. Reference line L1 needs not be parallel to the first sidewall 122 of housing 120. In other words, in one embodiment, the first insertion portion 114A and the second insertion portion 114B may be disposed diagonally. However, embodiments of the present disclosure are not limited to what is described herein, and the location of disposition of the insertion portions 114 may be varied so long as good support of housing 120 and electrode portions 116 is provided by insertion portions 114. For example, in one embodiment, the reference line L1 connecting the two insertion portions 114A and 114B may traverse through a direct projection of a combined center of mass of the electrode portions 116 and housing 120 on a plane defined by the main board portion 112. Accordingly, insertion portions 114 may firmly support housing 120 and electrode portions 116, thus rendering the manufacturing process of a lighting device that utilizes carrier structure 100 to flow more smoothly.

As described above, the locations of disposition of insertion portions 114 and electrode portions 116 are not limited to those illustrated in FIG. 1A. The description below refers to FIGS. 3, 4 and 5. FIG. 3 is a top view of a carrier structure in accordance with an embodiment of the present disclosure. Referring to FIG. 3, carrier structure 100A of FIG. 3 is similar to carrier structure 100 of FIG. 1A and thus similar components are labeled with the same numeral references. Carrier structure 100A differs from carrier structure 100 in that, in carrier structure 100A, the first insertion portion 114A and the second insertion portion 114B are covered by the third sidewall 126 and the fourth sidewall 128, respectively, not by the first sidewall 122 and the second sidewall 124.

FIG. 4 is a top view of a carrier structure in accordance with another embodiment of the present disclosure. Referring to FIG. 4, carrier structure 100B of FIG. 4 is similar to carrier structure 100A of FIG. 3 and thus similar components are labeled with the same numeral references. Carrier structure 100B differs from carrier structure 100A in that, in carrier structure 100B, the reference line L1 formed by the first insertion portion 114A and the second insertion portion 114B is parallel to the first sidewall 122 of housing 120. FIG. 5 is a top view of a carrier structure in accordance with yet another embodiment of the present disclosure. Referring to FIG. 5, carrier structure 100C of FIG. 5 is similar to carrier structure 100 of FIG. 1A and thus similar components are labeled with the same numeral references. Carrier structure 100C differs from carrier structure 100 in that, in carrier structure 100C, the reference line L1 formed by the first insertion portion 114A and the second insertion portion 114B is perpendicular to the first sidewall 122 of housing 120.

In one embodiment, other than supporting housing 120, insertion portions 114 are bonded to housing 120. This way, in subsequent steps of the manufacturing process, insertion portions 114 and main board portion 112 can better separate (e.g., during parts removal) when they are being separated, thus rendering the process to flow more smoothly. To improve the bonding between insertion portions 114 and housing 120, the structure of insertion portions 114 may be tailor-designed to suit the need. The following pertains to the description of FIGS. 6A, 6B, 7A, 7B, 8, 9 and 10.

FIG. 6A is a top view of a carrier structure in accordance with an embodiment of the present disclosure. FIG. 6B is a cross-sectional view of the carrier structure of FIG. 6A along line BB'. Referring to FIGS. 6A and 6B, carrier structure 100D of FIGS. 6A and 6B is similar to carrier structure 100 of FIG. 1A and thus similar components are labeled with the same numeral references. Carrier structure 100D differs from carrier structure 100 in that, in carrier structure 100D, each of the insertion portions 114 respectively includes one or more insertion through holes 114a. As shown in FIG. 6B, a part of housing 120 is embedded in insertion through holes 114a of insertion portions 114. In other words, insertion through holes 114a allow insertion portions 114 to grip onto housing 120 to be bonded to housing 120. Accordingly, the bonding strength between insertion portions 114 and main board portion 112 as well as housing 120 on both sides is increased. This renders the separation of insertion portions 114 and main board portion 112 during subsequent steps of the manufacturing process to flow more smoothly.

FIG. 7A is a top view of a carrier structure in accordance with an embodiment of the present disclosure. FIG. 7B is a cross-sectional view of the carrier structure of FIG. 7A along line CC'. Referring to FIGS. 7A and 7B, carrier structure 100E of FIGS. 7A and 7B is similar to carrier structure 100 of FIG. 1A and thus similar components are labeled with the same numeral references. Carrier structure 100E differs from carrier structure 100 in that, in carrier structure 100E, each of the insertion portions 114 respectively has a rough surface 114b. Insertion portions 114 are better bonded with housing 120 as the adjacent surface (rough surface 114b) of housing 120 is substantially conformed with the rough surface 114b of insertion portions 114. This renders the separation of insertion portions 114 and main board portion 112 during subsequent steps of the manufacturing process to flow more smoothly.

FIG. 8 is a top view of a carrier structure in accordance with an embodiment of the present disclosure. Referring to FIG. 8, carrier structure 100F of FIG. 8 is similar to carrier structure 100 of FIG. 1A and thus similar components are labeled with the same numeral references. Carrier structure 100F differs from carrier structure 100 in that, in carrier structure 100F, each of the insertion portions 114 respectively includes one or more insertion corners 114c. Insertion portions 114 are better bonded with housing 120 as insertion corners 114c of insertion portions 114 are embedded in housing 120. This renders the separation of insertion portions 114 and main board portion 112 during subsequent steps of the manufacturing process to flow more smoothly. Insertion corners 114c of insertion portions 114 and main board through hole 112a may be formed by a punch process. Thus, in carrier structure 100F, insertion corners 114c and main board portion 112 of lead frame 110 may be on the same plane. However, scope of the present disclosure is not limited to what is described herein. In some other embodiments, insertion corners 114c may be disposed at other suitable locations. Referring to FIG. 9, FIG. 9 is a cross-sectional view of a carrier structure in accordance with an embodiment of the present disclosure. Carrier structure 100G of FIG. 9 is similar to carrier structure 100 of FIG. 2A and thus similar components are labeled with the same numeral references. In carrier structure 100G, insertion corners 114c may generally extend in a direction D1 toward the opening of concavity 120a so as to be inserted into housing 120.

FIG. 10 is a cross-sectional view of a carrier structure in accordance with an embodiment of the present disclosure. Referring to FIG. 10, carrier structure 100H of FIG. 10 is similar to carrier structure 100 of FIG. 1A and thus similar components are labeled with the same numeral references. Carrier structure 100H differs from carrier structure 100 in that, in carrier structure 100H, each of the insertion portions 114 respectively includes a bending sub-portion 114d configured to be buried in housing 120. Specifically, bending sub-portions 114d may generally extend in a direction D1 toward the opening of concavity 120a to be buried in housing 120. The shape of bending sub-portions 114d helps gripping onto housing 120 to improve the bonding strength.

Figure 1B:
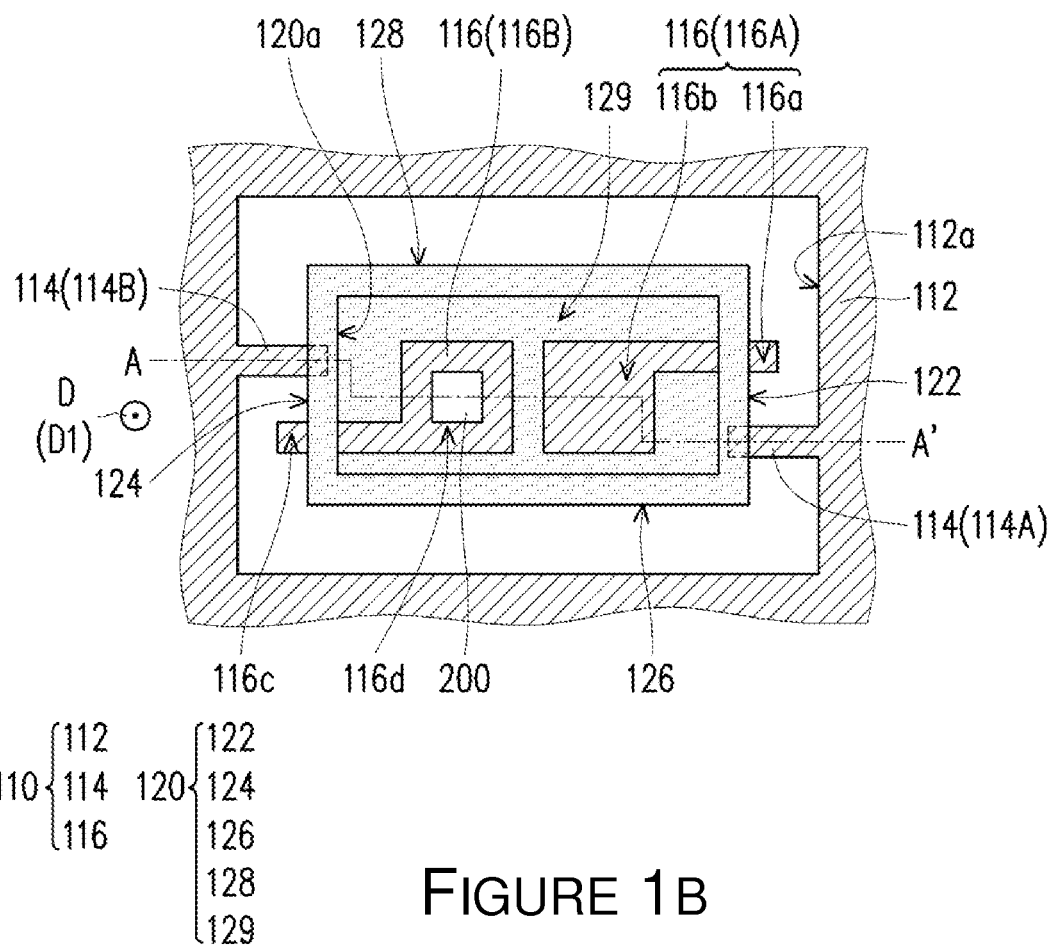
Figure 2B:
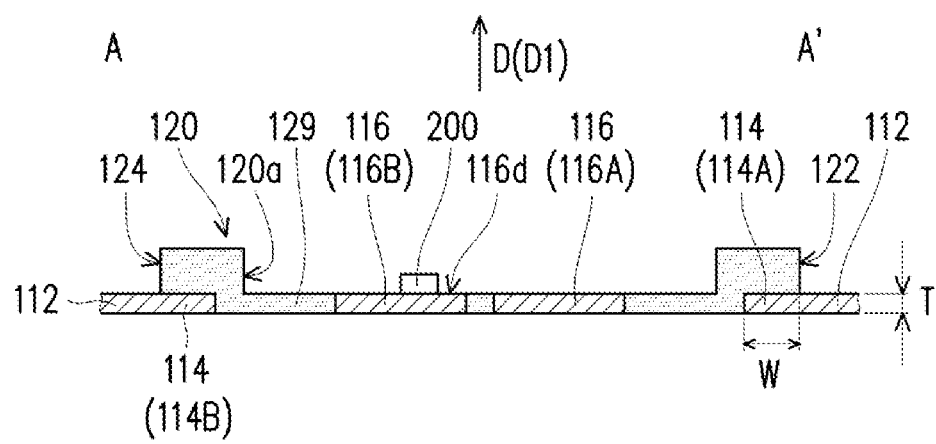
Figure 1C:
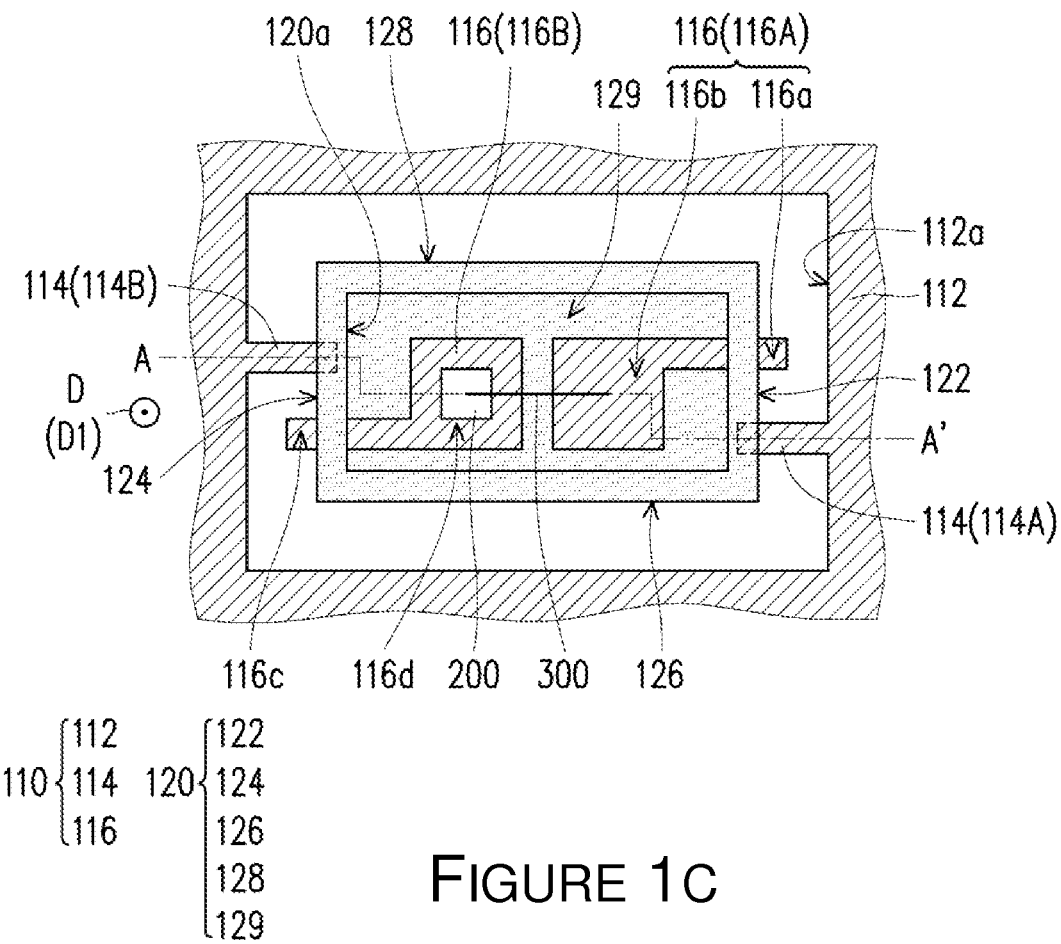
Figure 2C:
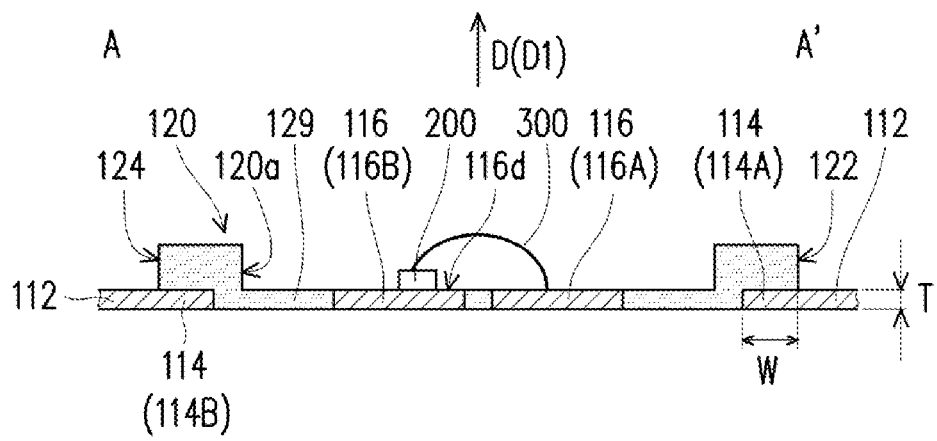

Referring to FIGS. 1B, 1C, 2B and 2C, after carrier structure 100 is provided, an LED 200 is electrically coupled to electrode portions 116. Specifically, as shown in FIGS. 1B and 2B, in one embodiment, a chip bonding process may be performed to bond LED 200 to one of the electrode portions 116. Then, as shown in FIGS. 1C and 2C, a wire bonding process may be performed to electrically couple LED 200 to the other electrode portion 116 with a bonding wire 300. However, scope of the present disclosure is not limited to what is described herein. In some other embodiments, LED 200 may be electrically coupled to electrode portions 116 by other methods such as, for example, flip chip bonding or other suitable methods.

Figure 1D:
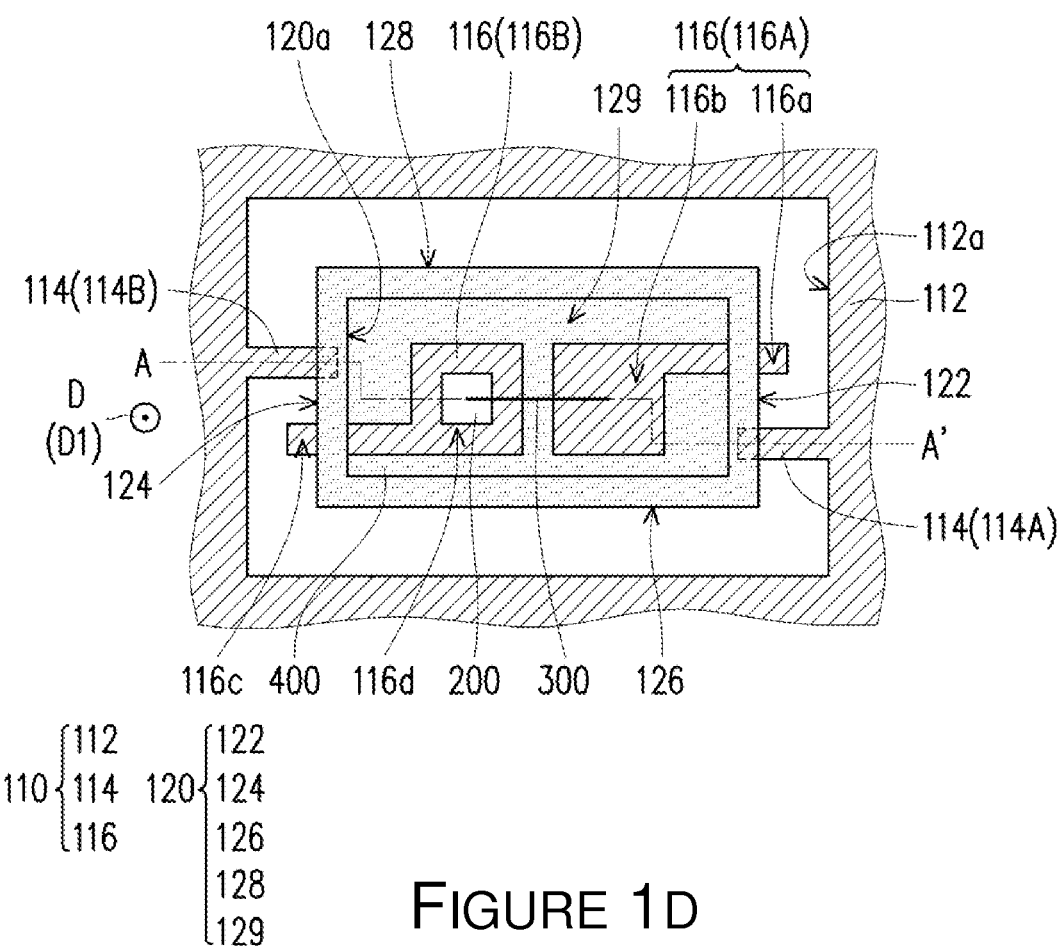
Figure 2D:
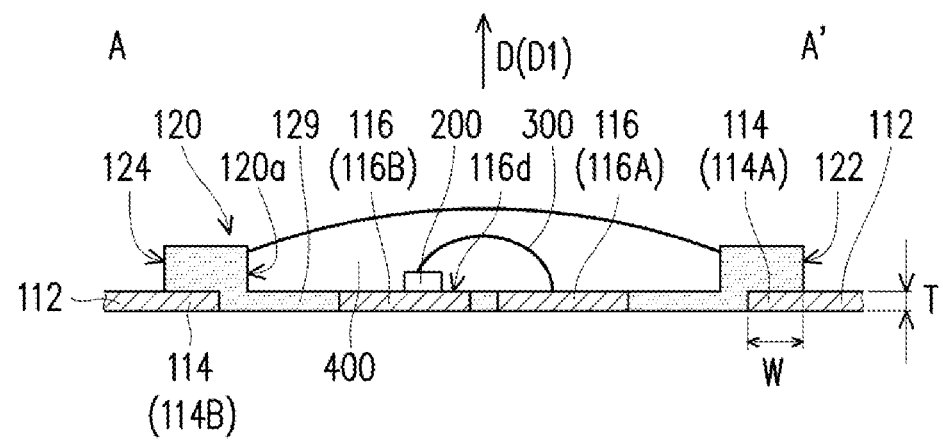
Figure 1E:
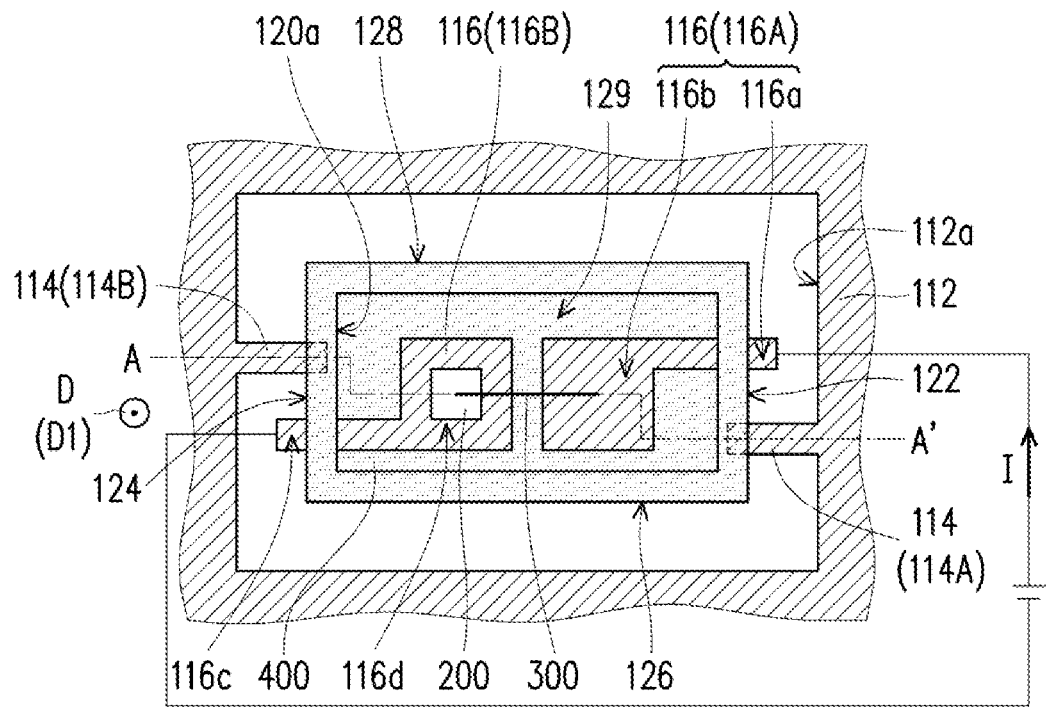
Figure 2E:
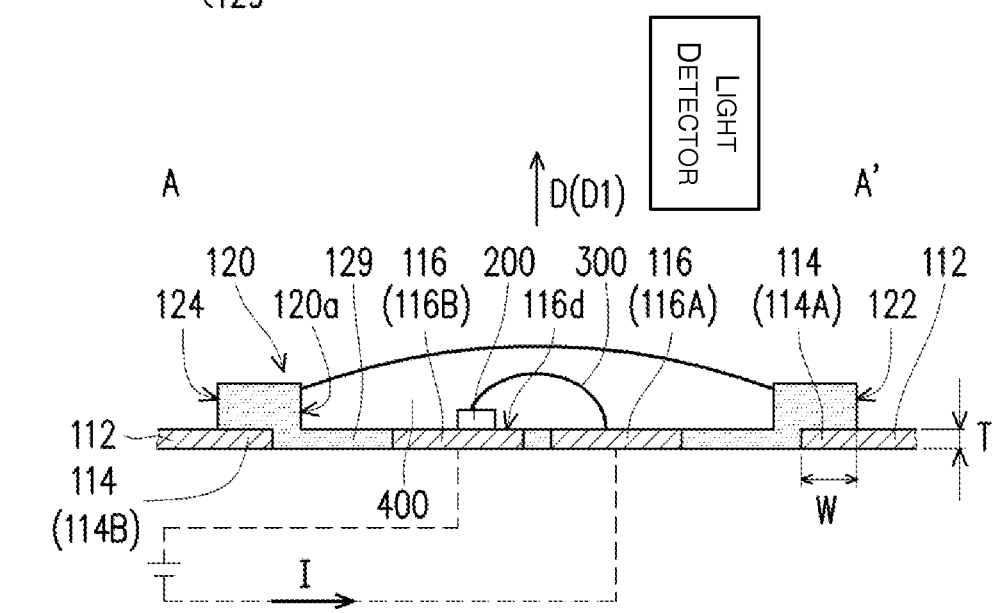

Referring to FIGS. 1D and 2D, an encapsulant 400 is filled into housing 120 to cover LED 200. The type of encapsulant 400 may depend on the desired optical characteristics (e.g., color) to be achieved as well as characteristics of LED 200. Notably, in one embodiment, in carrier structure 100, as electrode portions 116 are electrically insulated form insertion portions 114 and main board portion 112, inspection of LED 200 may be performed before parts removal (separation of insertion portions 114 and main board portion 112). In particular, as shown in FIGS. 1E and 2E, the process of inspection of LED 200 may include: an inspection signal I is inputted to protrusion sub-portions 116a and 116c or electrode portions 116A and 116B, respectively, and optical characteristics of light emitted by LED 200 is measured. That is, it is determined whether optical characteristics (e.g., color, brightness, etc.) of light emitted by LED 200 after traversing through encapsulant 400 fall within specified ranges of values. The measurement of optical characteristics of LED 200 may be performed using one or more photodetectors. This renders the manufacturing process of lighting devices to flow more smoothly.

Figure 1F:
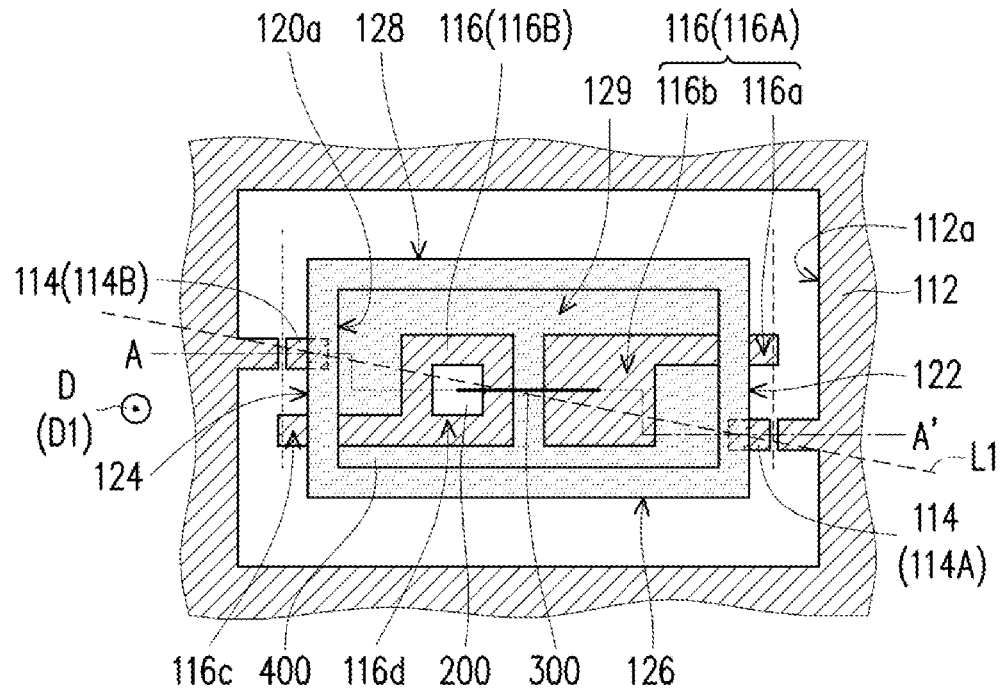
Figure 2F:
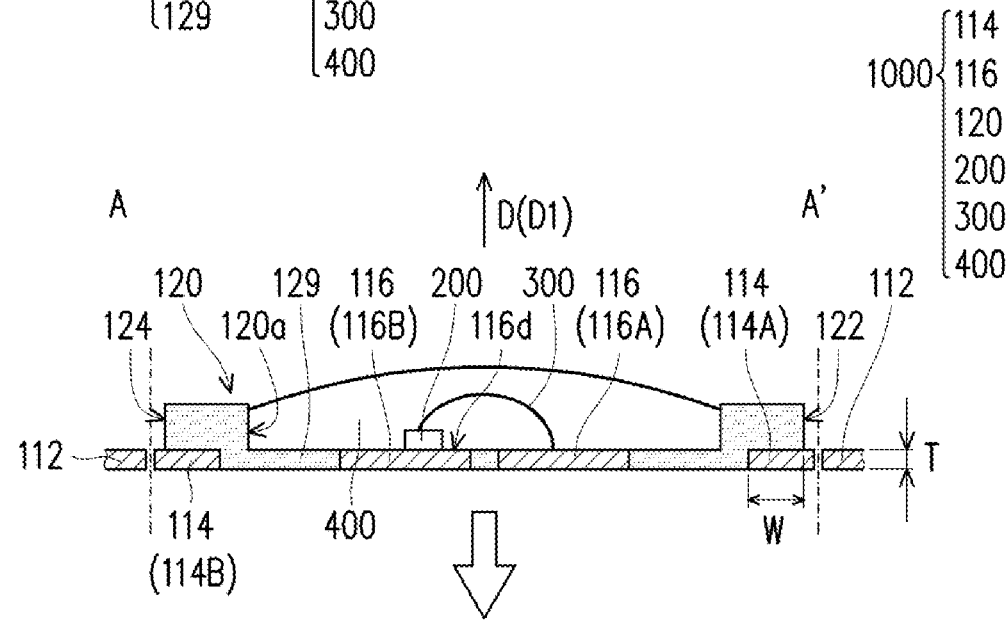

Referring to FIGS. 1F and 2F, insertion portions 114 and main board portion 112 are separated to form a lighting device 1000 of the present disclosure. Specifically, with insertion portions 114 on both sides bonded to main board portion 112 and housing 120 on both sides, insertion portions 114 may be disconnected from main board portion 112 by a punch mold. In particular, in one embodiment, a stamping process may be used to separate insertion portions 114 and main board portion 112. However, scope of the present disclosure is not limited to what is described herein. In some other embodiments, other methods (e.g., laser cutting) may be used to separate insertion portions 114 and main board portion 112. After the separation of insertion portions 114 and main board portion 112, insertion portions 114, electrode portions 116, housing 120, LED 200, binding wire 300 and encapsulant 400 will fall to complete lighting device 1000 of the present disclosure.

Compared to carrier structure 100 of the present disclosure, lighting device 1000 of the present disclosure further includes LED 200 which is electrically coupled to electrode portions 116, bonding wire 300 and encapsulant 400, but without main board portion 112 of carrier structure 100. Thus, the structure of lighting device 1000 of the present disclosure may be clearly understood with reference to above description of carrier structure 100 and FIGS. 1E and 2F, and a description thereof will not be repeated. Notably, in lighting device 1000, at least a part of insertion portions 114 is embedded in housing 120. In other words, insertion portions 114 of lighting device 1000 need not be partially exposed outside of housing 120 as shown in FIG. 1F. In some other embodiments, one end of insertion portions 114 of lighting device 1000 may be cut to be flush with a corresponding sidewall of housing 120 to be completely buried in housing 120 of lighting device 1000.

FIG. 11 is a diagram of a lighting device manufactured with the carrier structure of FIG. 3 according to a manufacturing process in accordance with the present disclosure. FIG. 12 is a diagram of a lighting device manufactured with the carrier structure of FIG. 4 according to a manufacturing process in accordance with the present disclosure. FIG. 13 is a diagram of a lighting device manufactured with the carrier structure of FIG. 5 according to a manufacturing process in accordance with the present disclosure. FIGS. 14A and 14B are diagrams of a lighting device manufactured with the carrier structure of FIGS. 6A and 6B, respectively, according to a manufacturing process in accordance with the present disclosure. FIGS. 15A and 15B are diagrams of a lighting device manufactured with the carrier structure of FIGS. 7A and 7B, respectively, according to a manufacturing process in accordance with the present disclosure. FIG. 16 is a diagram of a lighting device manufactured with the carrier structure of FIG. 8 according to a manufacturing process in accordance with the present disclosure. FIG. 17 is a diagram of a lighting device manufactured with the carrier structure of FIG. 9 according to a manufacturing process in accordance with the present disclosure. FIG. 18 is a diagram of a lighting device manufactured with the carrier structure of FIG. 10 according to a manufacturing process in accordance with the present disclosure.

Compared to carrier structures 100A-100H of the present disclosure, lighting devices 1000A-1000H further include LED 200 which is electrically coupled to electrode portions 116, bonding wire 300 and encapsulant 400, but without main board portion 112 of carrier structures 100A-100H. Thus, the structure of lighting devices 1000A-1000H of the present disclosure may be clearly understood with reference to above description of carrier structures 100A-100H and FIGS. 11-18, and a description thereof will not be repeated.

In view of the above, according to an embodiment of a manufacturing process of a lighting device of the present disclosure, parts removal is achieved by way of separation of insertion portions of lead frame from main board portion to form a lighting device. Thus, compared to prior art, during parts removal in accordance with the present disclosure severe friction between lead frame and housing does not easily occur. Accordingly, the issue with debris associated with the prior art may be improved to render the manufacturing process of lighting devices to flow more smoothly. Additionally, in the carrier structure of an embodiment of the present disclosure, insertion portions support the housing and electrode portions, and electrode portions are disconnected with main board portion and separate from insertion portions. Thus, pretest activities may be performed on a lighting device of the present disclosure.

Additional Notes

Embodiments of a carrier structure and lighting device in accordance with the present disclosure are not limited to those described herein. The actual design and implementation may vary from the embodiments described herein. Those ordinarily skilled in the art may make various deviations and improvements based on the disclosed embodiments, and such deviations and improvements are still within the scope of the present disclosure. Accordingly, the scope of protection of a patent issued from the present disclosure is determined by the claims as follows.

In the above description of exemplary implementations, for purposes of explanation, specific numbers, materials configurations, and other details are set forth in order to better explain the present disclosure, as claimed. However, it will be apparent to one skilled in the art that the claimed subject matter may be practiced using different details than the exemplary ones described herein. In other instances, well-known features are omitted or simplified to clarify the description of the exemplary implementations.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

For the purposes of this disclosure and the claims that follow, the terms "coupled" and "connected" may have been used to describe how various elements interface. Such described interfacing of various elements may be either direct or indirect.

What is claimed is:

1. A carrier structure configured to carry a light-emitting diode (LED), comprising:
   a housing which defines a concavity; and
   a lead frame, comprising:
      a main board portion having a main board through hole;
      at least two insertion portions extending from the main board portion into the main board through hole, the housing disposed over the at least two insertion portions with the at least two insertion portions inserted into the housing; and
      two electrode portions configured to be electrically coupled to the LED, the concavity of the housing exposing the two electrode portions, each of the two electrode portions having a respective protrusion sub-portion that extends outside of the housing,
      wherein the two electrode portions and the main board portion are separate and electrically insulated from each other, and
      wherein the respective protrusion sub-portion of at least one of the two electrode portions is configured to receive an inspection signal.

2. The carrier structure of claim 1, wherein the at least two insertion portions comprise a first insertion portion and a second insertion portion, wherein the two electrode portions comprise a first electrode portion and a second electrode portion, wherein the respective protrusion sub-portion of the first electrode portion comprises a first protrusion sub-portion, wherein the respective protrusion sub-portion of the second electrode portion comprises a second protrusion sub-portion, and wherein the first protrusion sub-portion, the first insertion portion, the second protrusion sub-portion and the second insertion portion are arranged in a clockwise order.

3. The carrier structure of claim 1, wherein the housing and the two electrode portions have a combined center of mass, and wherein a reference line connecting the at least two insertion portions traverses through a direct projection of the center of mass on a plane defined by the main board portion.

4. The carrier structure of claim 1, wherein the housing comprises a bottom and a second sidewall that is connected to the bottom, wherein the two electrode portions of the lead frame are embedded in the bottom of the housing, wherein the bottom and the second sidewall of the housing define the concavity, wherein the concavity is configured to receive the LED therein, wherein one of the two electrode portions comprises a carrier sub-portion facing the LED, and wherein the second sidewall of the housing protrudes in a direction which is perpendicular to the carrier sub-portion and covers one of the at least two insertion portions at least partially.

5. The carrier structure of claim 1, wherein at least one of the at least two insertion portions comprises an insertion through hole, and wherein the housing is embedded in the insertion through hole.

6. The carrier structure of claim 1, wherein at least one of the at least two insertion portions comprises a rough surface, and wherein an adjacent surface of the housing is substantially conformed with the rough surface of the at least one of the at least two insertion portions.

7. The carrier structure of claim 1, wherein at least one of the at least two insertion portions comprises an insertion corner, and wherein the insertion corner is embedded in the housing.

8. The carrier structure of claim 1, wherein at least one of the at least two insertion portions comprises a bending sub-portion, and wherein the bending sub-portion generally extends in a direction toward an opening of the concavity and is buried in the housing.

9. The carrier structure of claim 1, wherein the at least one of the two electrode portions further comprises a carrier sub-portion connected to the protrusion sub-portion, and wherein the housing surrounds and exposes the carrier sub-portion.

10. A lighting device, comprising:
    a light-emitting diode (LED);
    a housing which defines a concavity; and
    a lead frame, comprising:
       at least two insertion portions extending into the housing; and
       two electrode portions electrically coupled to the LED with the LED disposed on and carried by one of the two electrode portions, the concavity of the housing exposing the two electrode portions, each of the two electrode portions having a respective protrusion sub-portion that extends outside of the housing,
       wherein the at least two insertion portions and the two electrode portions are separate from each other, and
       wherein the respective protrusion sub-portion of at least one of the two electrode portions is configured to receive an inspection signal.

11. The lighting device of claim 10, wherein the at least two insertion portions comprise a first insertion portion and a second insertion portion, wherein the two electrode portions comprise a first electrode portion and a second electrode portion, wherein the respective protrusion sub-portion of the first electrode portion comprises a first protrusion sub-portion, wherein the respective protrusion sub-portion of the second electrode portion comprises a second protrusion sub-portion, and wherein the first protrusion sub-portion, the first insertion portion, the second protrusion sub-portion and the second insertion portion are arranged in a clockwise order.

12. The lighting device of claim 10, wherein the housing and the two electrode portions have a combined center of mass, and wherein a reference line connecting the at least two insertion portions traverses through a direct projection of the center of mass.

13. The lighting device of claim 10, wherein the housing comprises a bottom and a second sidewall that is connected to the bottom, wherein the two electrode portions of the lead frame are embedded in the bottom of the housing, wherein the bottom and the second sidewall of the housing define the concavity, wherein the LED is disposed in the concavity, wherein one of the two electrode portions comprises a carrier sub-portion facing the LED, and wherein the second sidewall of the housing protrudes in a direction which is perpendicular to the carrier sub-portion and covers one of the at least two insertion portions at least partially.

14. The lighting device of claim 10, wherein at least one of the at least two insertion portions comprises an insertion through hole, and wherein the housing is embedded in the insertion through hole.

15. The lighting device of claim 10, wherein at least one of the at least two insertion portions comprises a rough surface, and wherein an adjacent surface of the housing is substantially conformed with the rough surface of the at least one of the at least two insertion portions.

16. The lighting device of claim 10, wherein at least one of the at least two insertion portions comprises an insertion corner, and wherein the insertion corner is embedded in the housing.

17. The lighting device of claim 10, wherein at least one of the at least two insertion portions comprises a bending sub-portion, and wherein the bending sub-portion generally extends in a direction toward an opening of the concavity and is buried in the housing.

18. The lighting device of claim 10, wherein a protrusion sub-portion of at least one of the two electrode portions is configured to receive an inspection signal.

19. The lighting device of claim 18, wherein the at least one of the two electrode portions further comprises a carrier sub-portion connected to the protrusion sub-portion, and wherein the housing surrounds and exposes the carrier sub-portion.

* * * * *